(12) United States Patent
Fujimoto et al.

(10) Patent No.: US 10,730,742 B2
(45) Date of Patent: Aug. 4, 2020

(54) ACTUATOR WITH PLURALITY OF TORSION BARS HAVING VARYING SPRING CONSTANT

(75) Inventors: Kenjiro Fujimoto, Kanagawa (JP); Yuuichi Yamamura, Yamanashi (JP)

(73) Assignees: PIONEER CORPORATION, Kanagawa (JP); PIONEER MICRO TECHNOLOGY CORPORATION, Yamanashi (JP)

(*) Notice: Subject to any disclaimer, the term of this patent is extended or adjusted under 35 U.S.C. 154(b) by 1204 days.

(21) Appl. No.: 14/373,554

(22) PCT Filed: Jan. 24, 2012

(86) PCT No.: PCT/JP2012/051384
§ 371 (c)(1),
(2), (4) Date: Sep. 24, 2014

(87) PCT Pub. No.: WO2013/111265
PCT Pub. Date: Aug. 1, 2013

(65) Prior Publication Data
US 2015/0203346 A1    Jul. 23, 2015

(51) Int. Cl.
*B81B 3/00* (2006.01)
*G02B 26/10* (2006.01)
(Continued)

(52) U.S. Cl.
CPC .......... *B81B 3/0078* (2013.01); *B81B 3/0045* (2013.01); *B81B 3/0072* (2013.01);
(Continued)

(58) Field of Classification Search
CPC ... B81B 3/0078; B81B 3/0045; B81B 3/0072; B81B 2203/0154; B81B 3/007;
(Continued)

(56) References Cited

U.S. PATENT DOCUMENTS 5,969,465 A * 10/1999 Neukermans ......... B81B 3/0078
310/333
5,999,303 A * 12/1999 Drake .................... H02N 1/008
359/223.1
(Continued)

FOREIGN PATENT DOCUMENTS

JP    2001-001300    1/2001
JP    2001-525972    12/2001
(Continued)

OTHER PUBLICATIONS ip.com search.*

(Continued)

*Primary Examiner* — Maged M Almawri
(74) *Attorney, Agent, or Firm* — Young & Thompson

(57) ABSTRACT

An actuator (1) is provided with: a movable part (120); a support part (110, 210) which supports the movable part; and a plurality of torsion bars (230) (i) each of which connects the movable part and the support part along a long direction such that the movable part is capable of swinging around a rotational axis which is along the long direction and (ii) which are arranged along a short direction; the farther each torsion bar is from the rotational axis, the smaller a spring constant of each torsion bar is.

10 Claims, 12 Drawing Sheets

(51) Int. Cl.
G02B 26/08 (2006.01)
G02B 27/01 (2006.01)

(52) U.S. Cl.
CPC ........... G02B 26/085 (2013.01); G02B 26/10 (2013.01); G02B 26/105 (2013.01); B81B 2203/0154 (2013.01); G02B 27/0176 (2013.01); Y10T 74/10 (2015.01)

(58) Field of Classification Search
CPC .... G02B 3/0072; G02B 26/085; G02B 26/10; G02B 26/105; G02B 27/0176; Y10T 74/10
USPC ......... 359/196.1, 199.4, 201.2, 203.1, 197.1, 359/223.1, 224.1, 211.5; 310/300–309, 310/40 MM
See application file for complete search history.

(56) References Cited

U.S. PATENT DOCUMENTS

| | | | | |
|---|---|---|---|---|
| 6,392,220 | B1* | 5/2002 | Slater | B81B 3/0051 |
| | | | | 250/216 |
| 7,793,404 | B2 | 9/2010 | Murakami et al. | |
| 7,821,694 | B2* | 10/2010 | Asai | G02B 26/0858 |
| | | | | 359/224.1 |
| 7,872,394 | B1* | 1/2011 | Gritters | H02N 1/006 |
| | | | | 216/6 |
| 8,379,283 | B2 | 2/2013 | Klose et al. | |
| 8,564,928 | B2 | 10/2013 | Ikehashi et al. | |
| 8,654,426 | B2* | 2/2014 | Yamada | G02B 26/0858 |
| | | | | 359/212.1 |
| 8,837,029 | B2* | 9/2014 | Yamada | G02B 26/0858 |
| | | | | 359/212.1 |
| 9,291,815 | B2* | 3/2016 | Horie | G02B 26/0858 |
| 2002/0114053 | A1 | 8/2002 | Yasuda et al. | |
| 2005/0200986 | A1* | 9/2005 | Tsuboi | G02B 26/0841 |
| | | | | 359/871 |
| 2005/0219674 | A1* | 10/2005 | Asai | G02B 26/0833 |
| | | | | 359/213.1 |
| 2006/0018049 | A1 | 1/2006 | Mizuno | |
| 2006/0071578 | A1* | 4/2006 | Drabe | G01C 19/5642 |
| | | | | 310/309 |
| 2006/0125346 | A1* | 6/2006 | Yoda | G02B 26/0841 |
| | | | | 310/309 |
| 2006/0152785 | A1* | 7/2006 | Yasuda | G02B 26/085 |
| | | | | 359/224.1 |
| 2007/0017994 | A1* | 1/2007 | Wolter | B81B 3/007 |
| | | | | 235/462.37 |
| 2007/0180672 | A1 | 8/2007 | Murakami et al. | |
| 2007/0222334 | A1* | 9/2007 | Wan | B81B 3/0051 |
| | | | | 310/309 |
| 2008/0054758 | A1* | 3/2008 | Tsuboi | H02N 1/008 |
| | | | | 310/309 |
| 2010/0097681 | A1* | 4/2010 | Klose | B81B 3/0062 |
| | | | | 359/213.1 |
| 2011/0063774 | A1 | 3/2011 | Ikehashi et al. | |
| 2011/0102870 | A1* | 5/2011 | Nakamura | G02B 26/085 |
| | | | | 359/198.1 |
| 2012/0062970 | A1* | 3/2012 | Yamada | G02B 7/1821 |
| | | | | 359/199.4 |
| 2012/0228460 | A1 | 9/2012 | Suzuki | |
| 2012/0257235 | A1* | 10/2012 | Hino | G02B 26/085 |
| | | | | 358/1.13 |
| 2014/0340726 | A1* | 11/2014 | Gu-Stoppel | G02B 26/0833 |
| | | | | 359/224.1 |

FOREIGN PATENT DOCUMENTS

| | | |
|---|---|---|
| JP | 2002-524271 | 8/2002 |
| JP | 2002-321198 | 11/2002 |
| JP | 2004-177543 | 6/2004 |
| JP | 2004-181552 | 7/2004 |
| JP | 2005-046958 | 2/2005 |
| JP | 2006-039066 | 2/2006 |
| JP | 2006-167860 | 6/2006 |
| JP | 2010-134432 | 6/2010 |
| JP | 2011-066150 | 3/2011 |
| JP | 2012-113043 | 6/2012 |
| WO | 98/09289 | 3/1998 |
| WO | 00/13210 | 3/2000 |
| WO | WO 2006/035762 | 4/2006 |
| WO | 2011/061833 | 5/2011 |

OTHER PUBLICATIONS

JP2006167860A English Machine Translation.*
International Search Report for PCT/JP2012/051384 dated Apr. 24, 2012.

* cited by examiner

[FIG. 1]
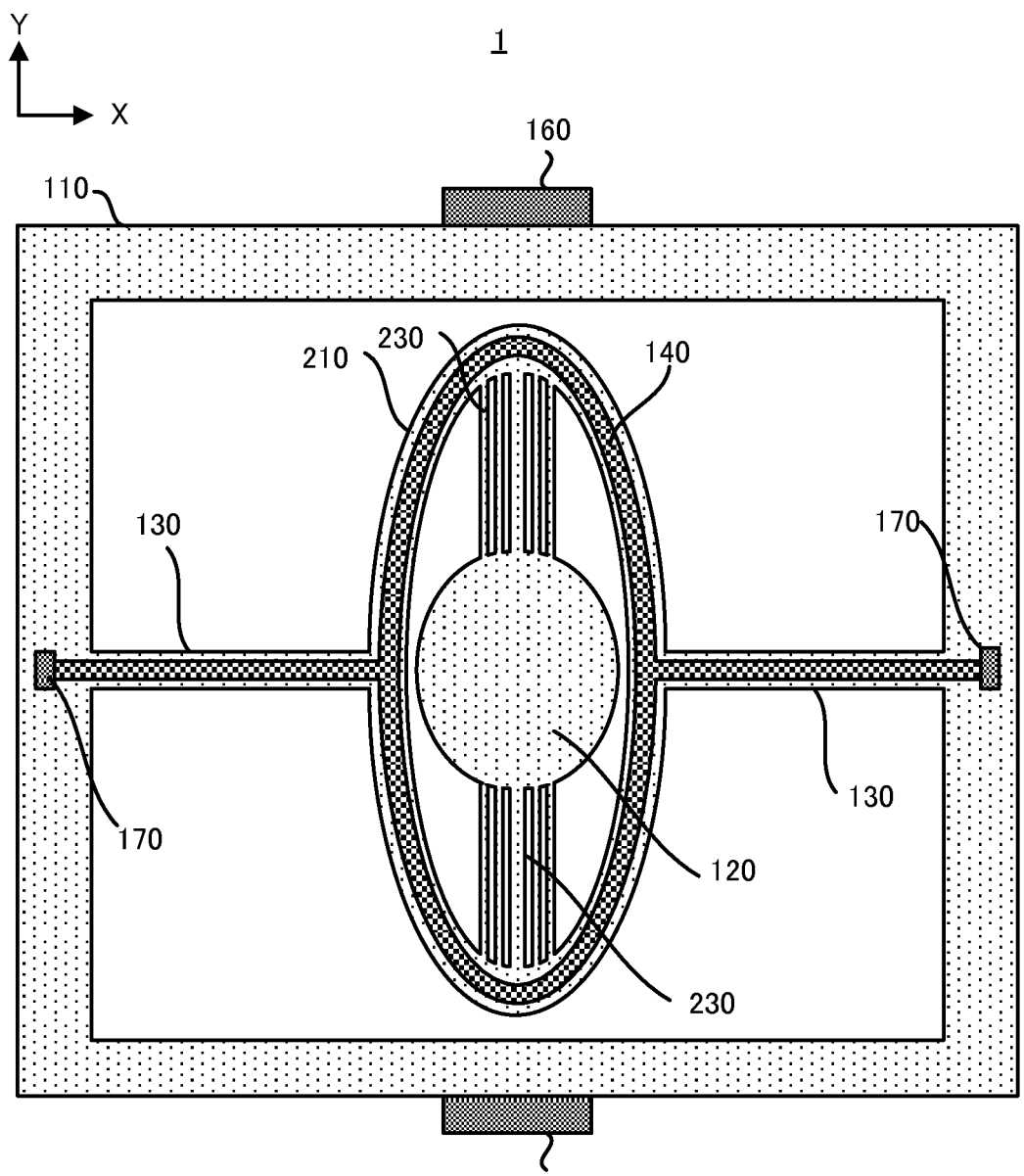

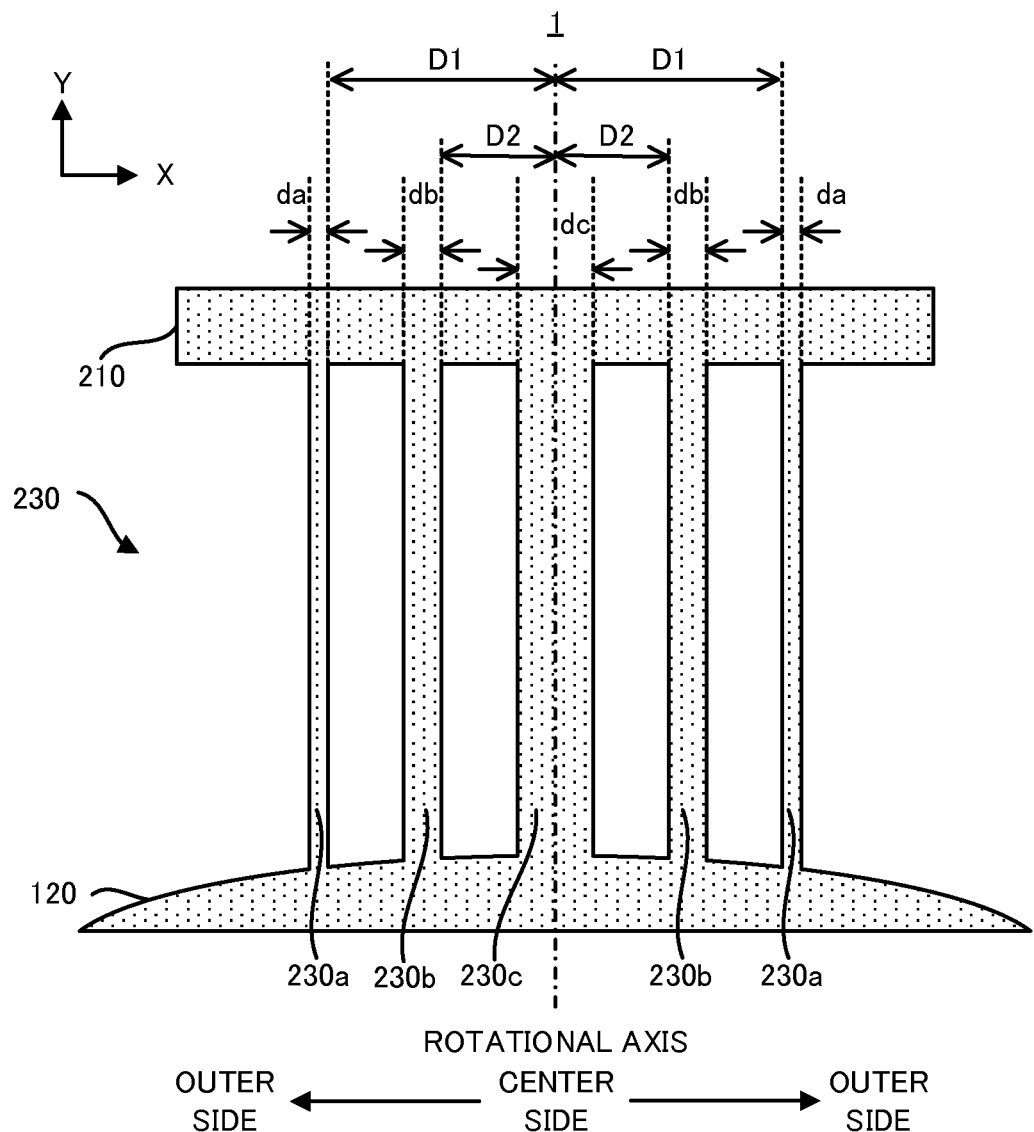
[FIG. 2]

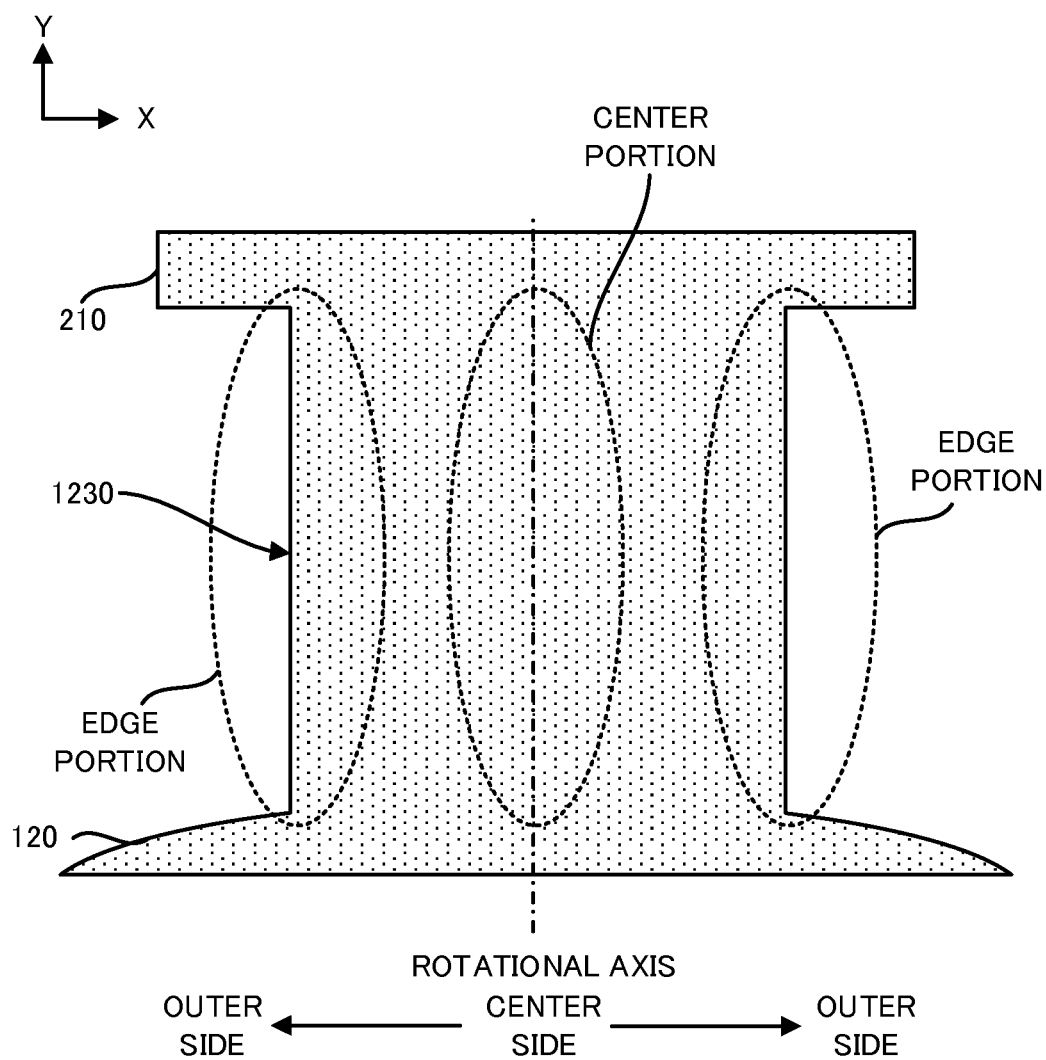
[FIG. 3]

[FIG. 4]
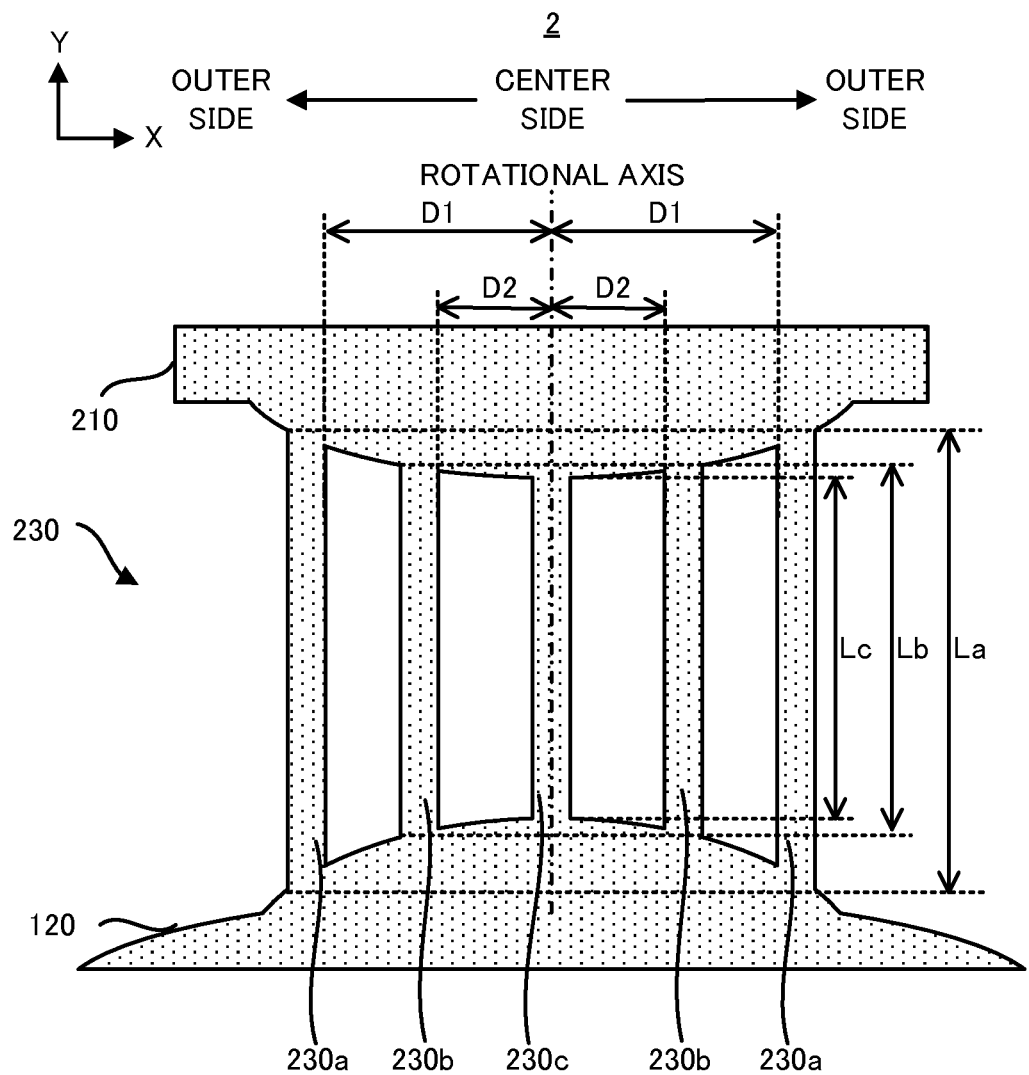

[FIG. 5]
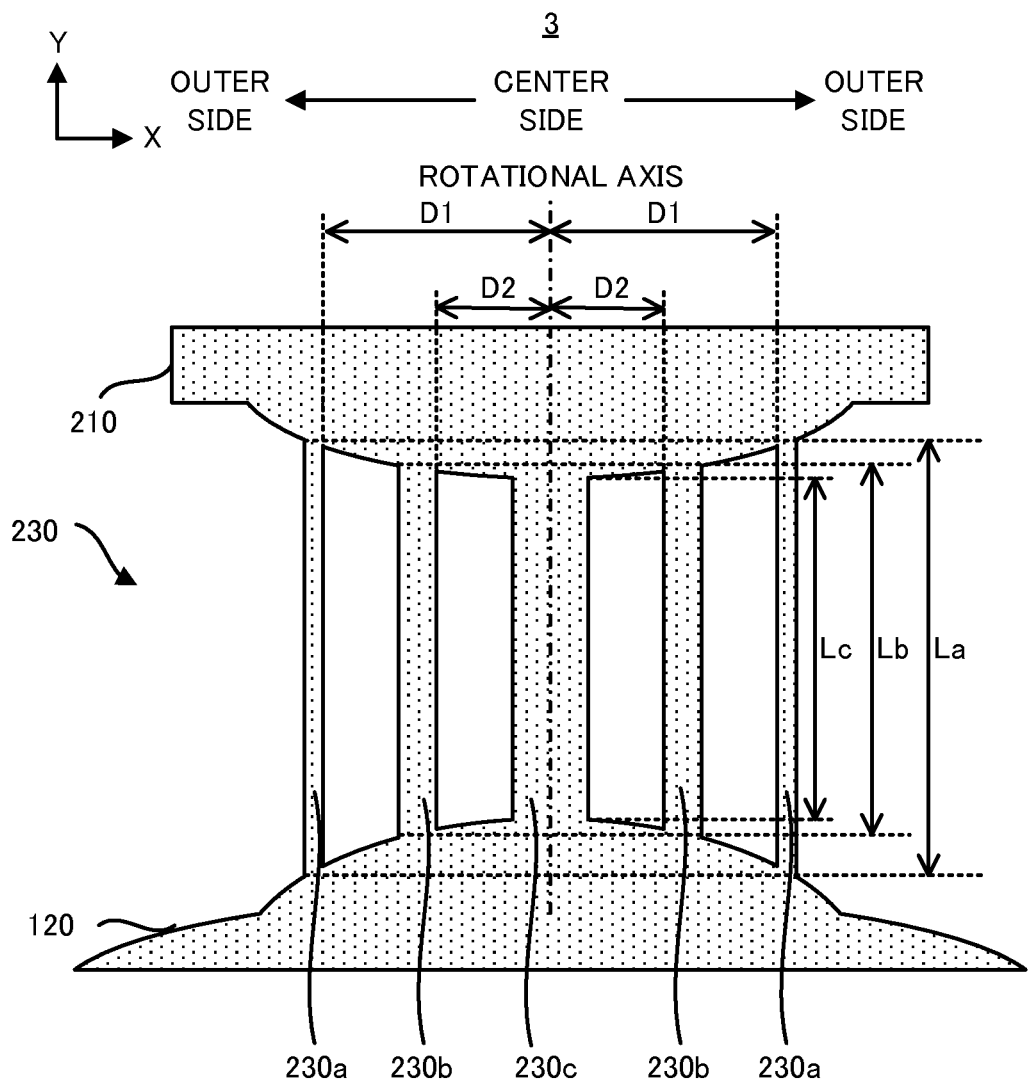

[FIG. 6]
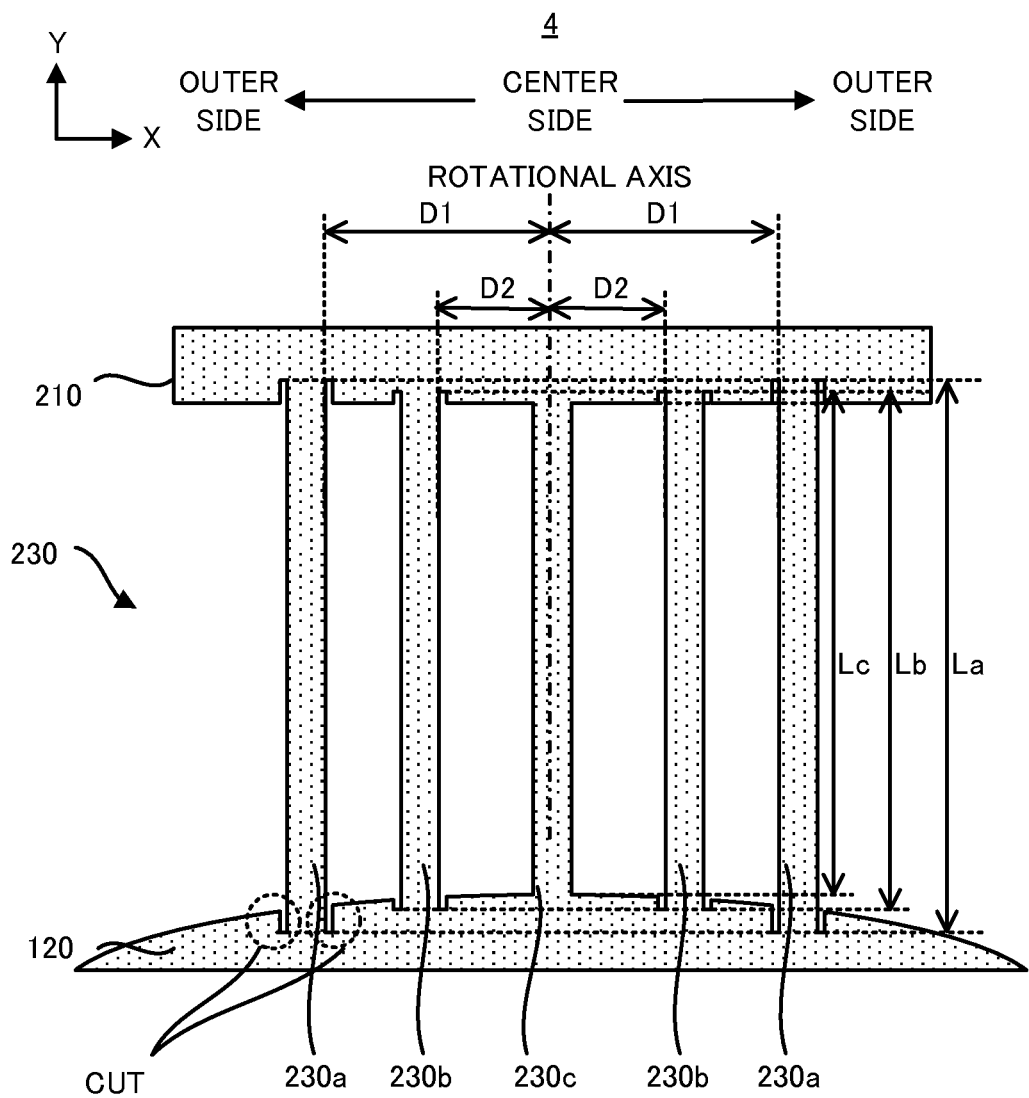

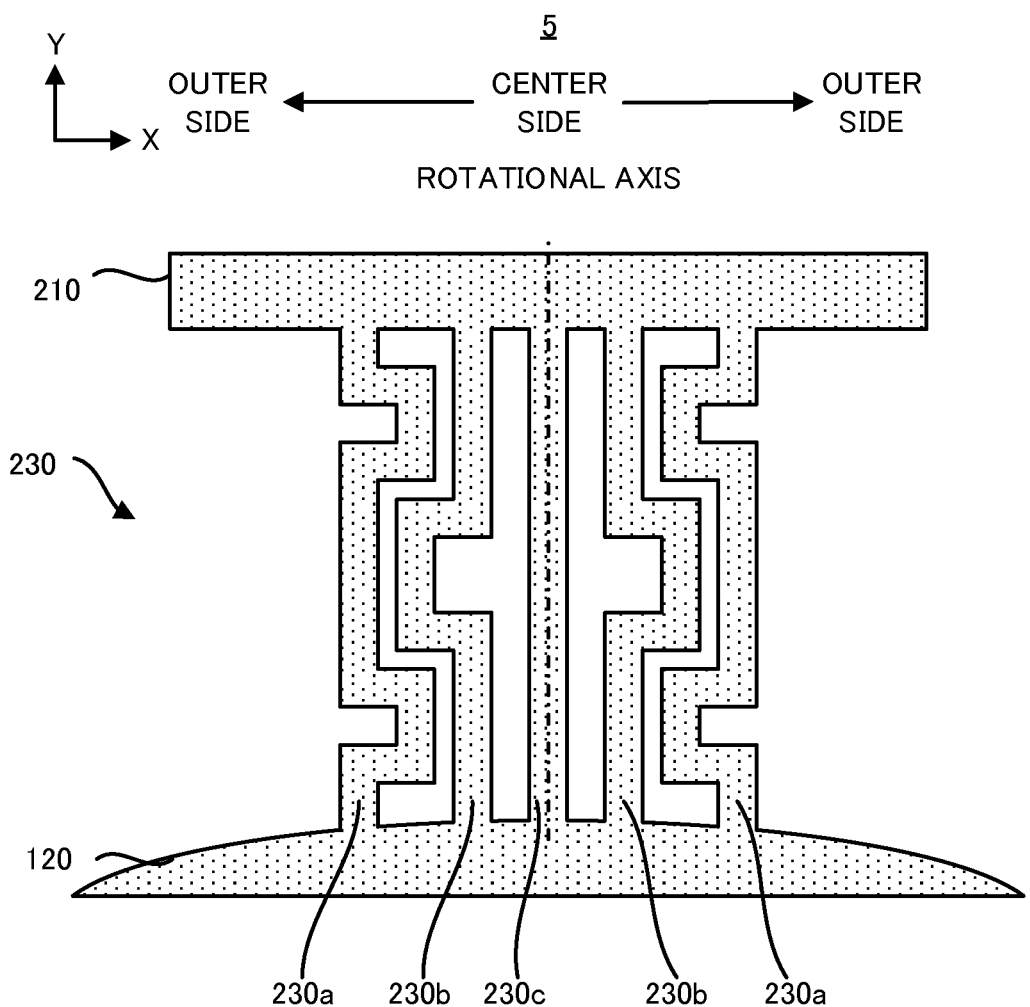

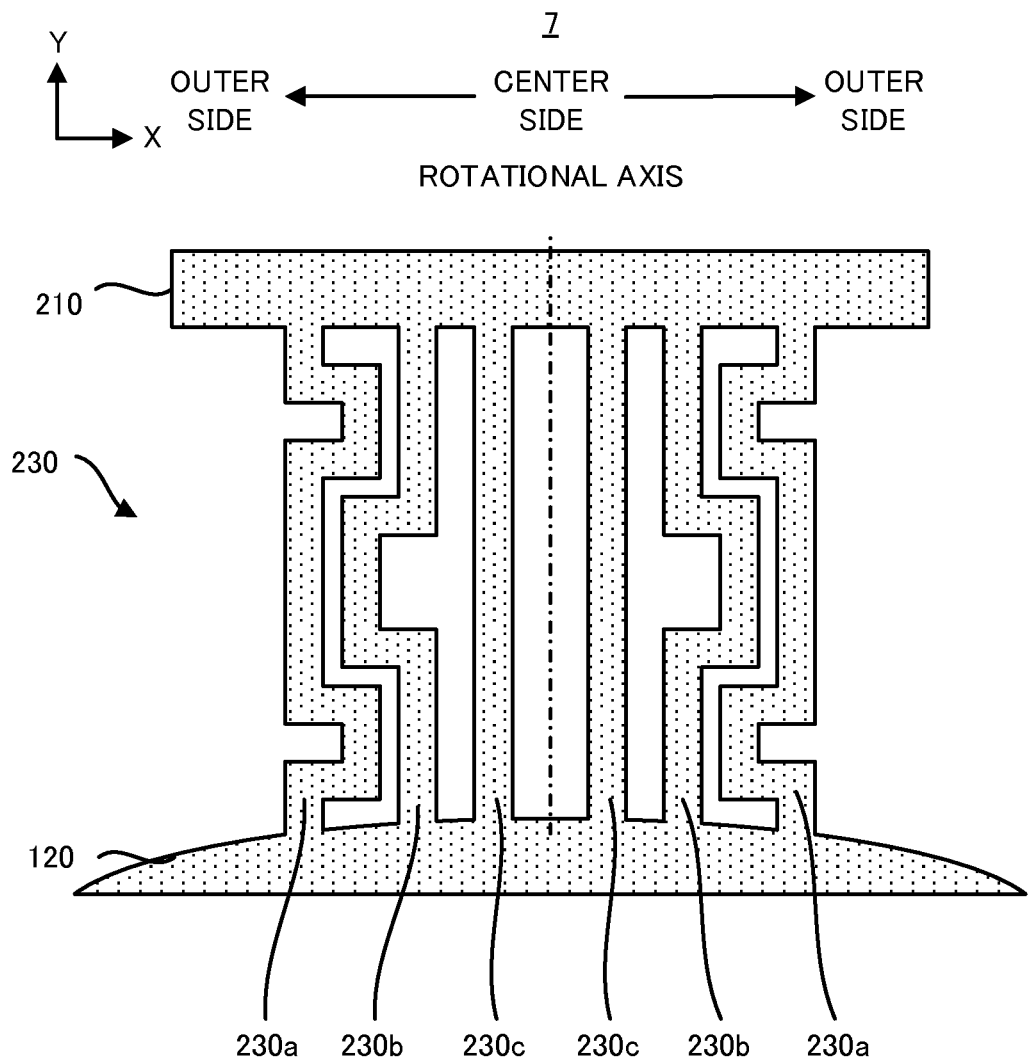
[FIG. 8]

[FIG. 9]
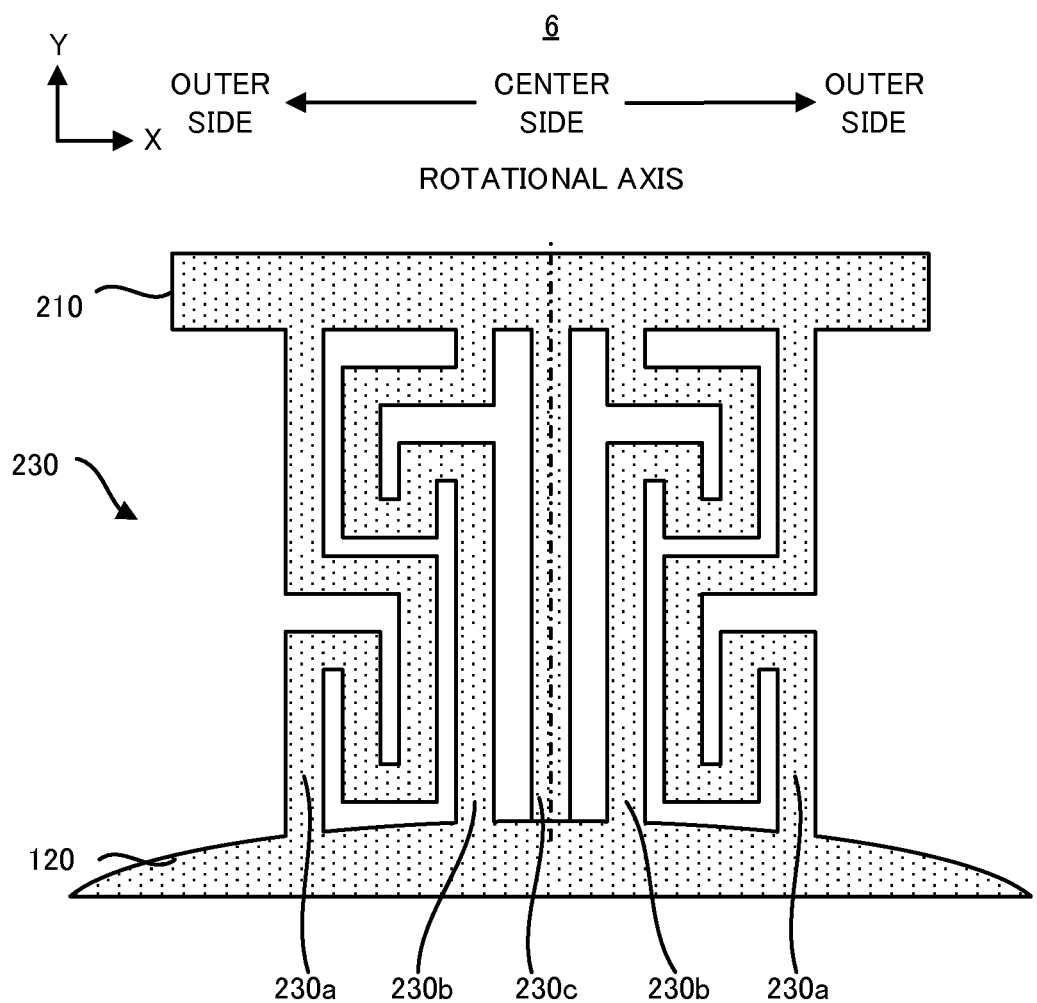

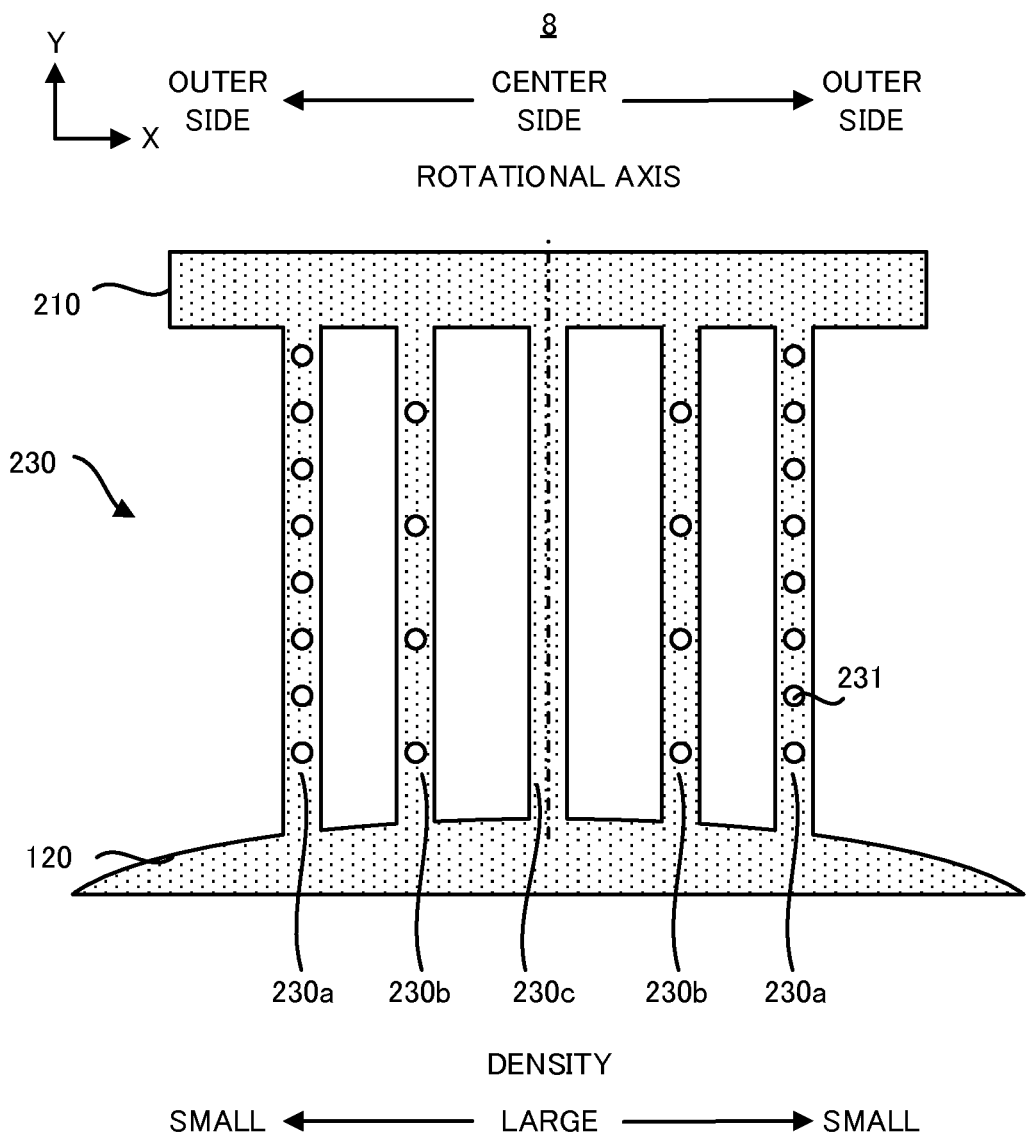

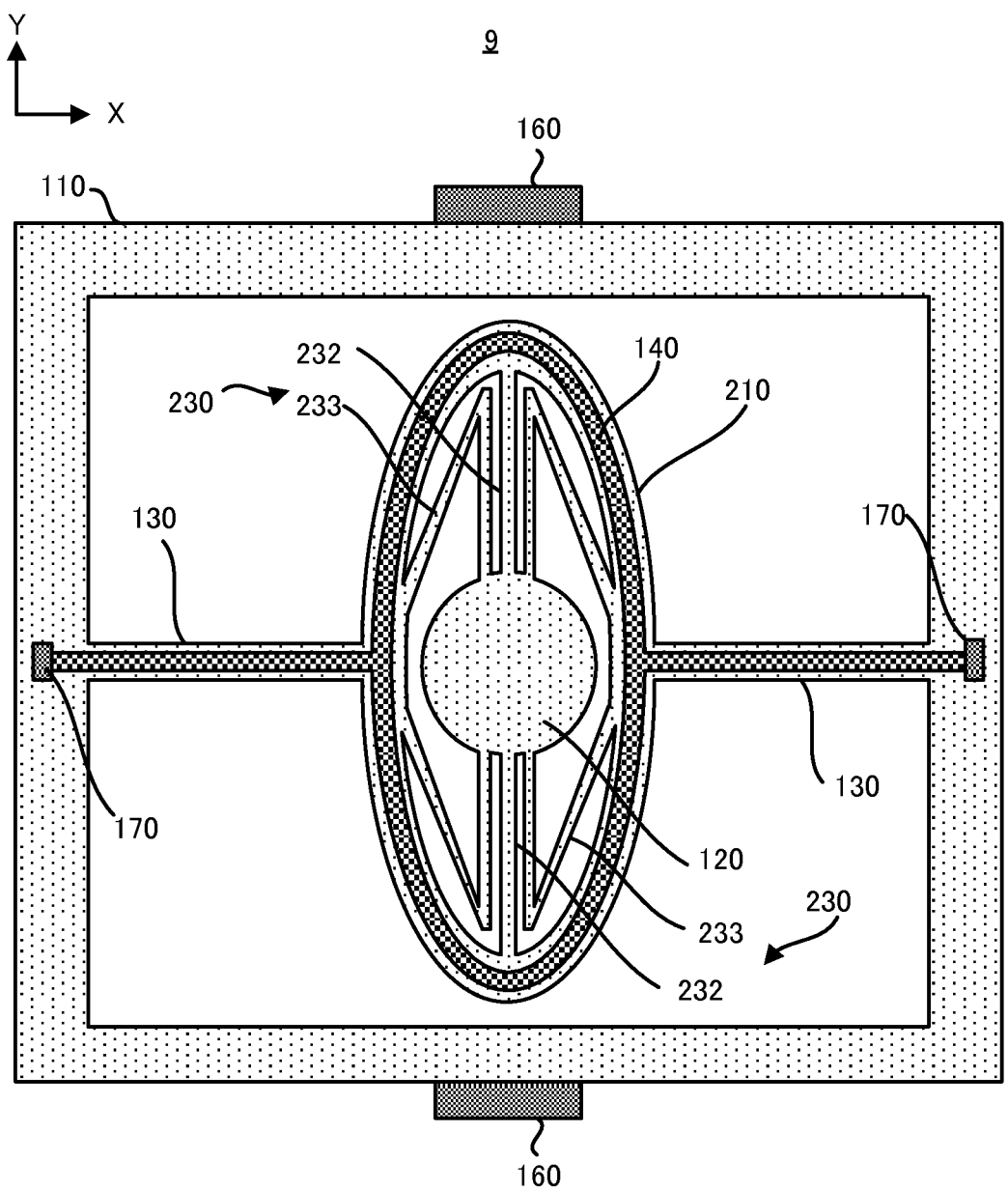
[FIG. 11]

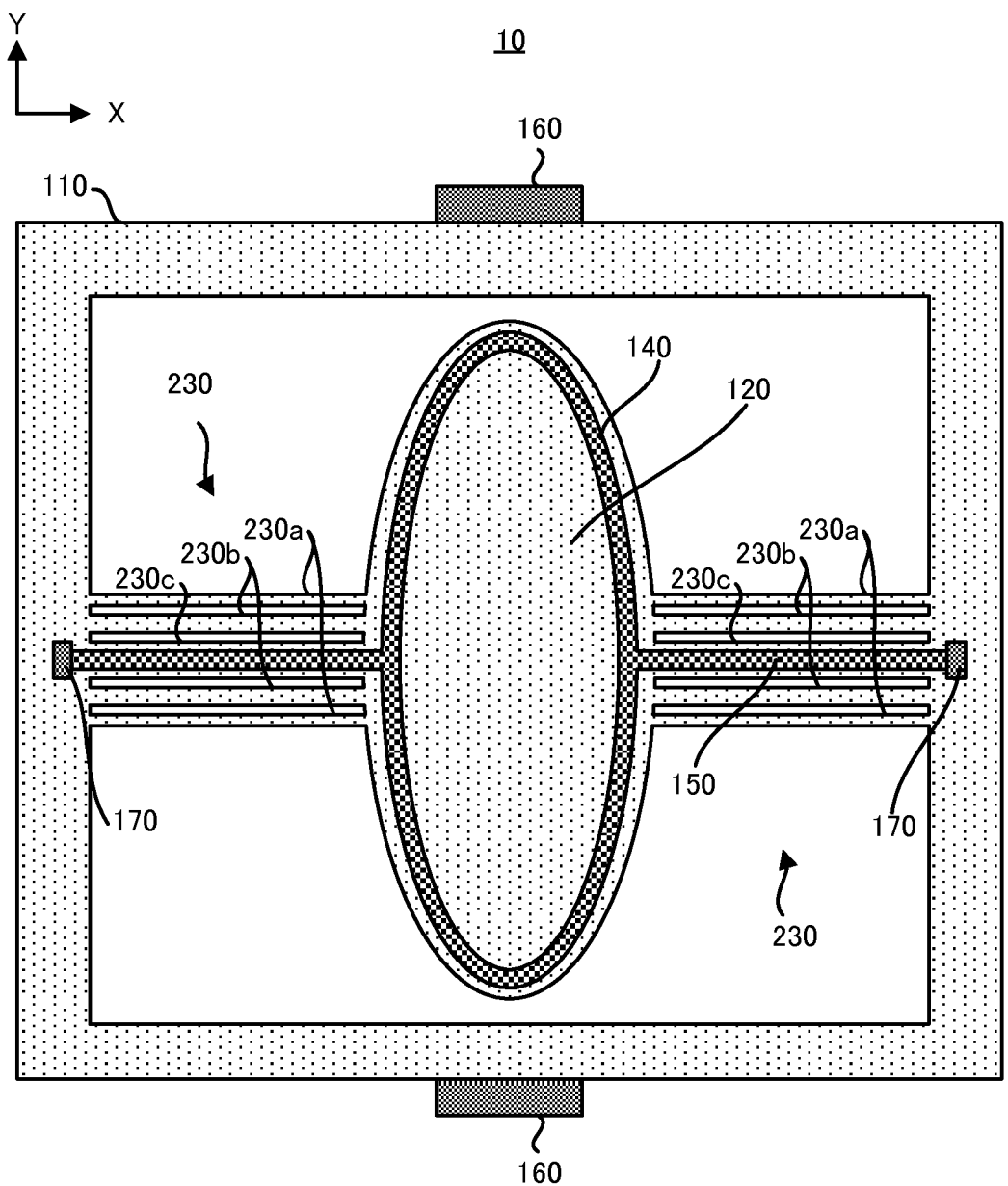
[FIG. 12]

ACTUATOR WITH PLURALITY OF TORSION BARS HAVING VARYING SPRING CONSTANT

TECHNICAL FIELD

The present invention relates to an actuator such as, for example, a MEMS scanner for rotating a movable part on which a mirror or the like is formed.

BACKGROUND ART

In various technical fields such as, for example, a display, a printing apparatus, precision measurement, precision processing, and information recording-reproduction, research on a micro electro mechanical system (MEMS) device manufactured by a semiconductor process technology is actively progressing. As the MEMS device as described above, a MEMS scanner which is used for scanning laser light. The MEMS scanner is provided with: a movable plate; a support frame which is in the form of a frame and which surrounds the movable plate; and a torsion bar which supports the movable plate to be an axis with respect to the movable part and the support frame such that the movable part is capable of swinging.

Patent literatures 1 to 3 are listed as one example of a related art which discloses such a MEMS scanner.

CITATION LIST

Patent Literature

Patent Literature 1: Published Japanese translation of a PCT application (Tokuhyo) No. 2001-525972
Patent Literature 2: Published Japanese translation of a PCT application (Tokuhyo) No. 2002-524271
Patent Literature 3: Japanese Patent Application Laid Open No. 2004-177543

SUMMARY OF INVENTION

Technical Problem

It is expected as a use of such a MEMS scanner that the MEMS scanner is used as an image display apparatus such as a head-up display for projecting image, for example. Here, when the MEMS scanner is used as the image display apparatus such as the head-up display, it is preferable that a swing frequency of the movable part (for example, a resonance frequency which is determined by mass of the movable part and spring constant of the torsion bar which supports the movable plate to be an axis) become larger.

As one method of enlarging the swing frequency of the movable part, a method of hardening the torsion bar (in other words, increasing the spring constant of the torsion bar) by thickening or shortening the torsion bar is conceived. However, the thickening of the torsion bar results in such a technical problem that stress, which is added to the torsion bar due to the swing of the movable part, increases by an amount of thickening the torsion bar. Similarly, the shortening of the torsion bar results in such a technical problem that the stress, which is added to the torsion bar due to the swing of the movable part, increases by an amount of shortening the torsion bar. As a result, such a technical problem is caused that the increasing of the stress leads to a destruction of the torsion bar.

The present invention is invented by considering the above conventional problem, for example, and has an object to provide an actuator which is capable of enlarging the swing frequency of the movable part while preventing or suppressing the destruction of the torsion bar.

Solution to Problem

In order to solve the above problem, an actuator is provided with: a movable part; a support part which supports the movable part; and a plurality of torsion bars (i) each of which connects the movable part and the support part along a long direction such that the movable part is capable of swinging around a rotational axis which is along the long direction and (ii) which are arranged along a short direction; the farther each torsion bar is from the rotational axis, the smaller a spring constant of each torsion bar is.

The operation and other advantages of the present invention will become more apparent from embodiments explained below.

BRIEF DESCRIPTION OF DRAWINGS

FIG. 1 is a plan view illustrating one example of a configuration of an actuator in a first example.

FIG. 2 is an enlarged plane view illustrating one example of a detailed shape of plurality of pairs of torsion bars which the actuator in the first example is provided with.

FIG. 3 is an enlarged plan view illustrating one example of a configuration of an actuator in a comparative example which rotates a movable part by using only one torsion bar located on a rotational axis.

FIG. 4 is an enlarged plane view illustrating one example of a detailed shape of plurality of pairs of torsion bars which the actuator in the second example is provided with.

FIG. 5 is an enlarged plane view illustrating one example of a detailed shape of plurality of pairs of torsion bars which the actuator in the third example is provided with.

FIG. 6 is an enlarged plane view illustrating one example of a detailed shape of plurality of pairs of torsion bars which the actuator in the fourth example is provided with.

FIG. 7 is an enlarged plane view illustrating one example of a detailed shape of plurality of pairs of torsion bars which the actuator in the fifth example is provided with.

FIG. 8 is an enlarged plane view illustrating one example of a detailed shape of plurality of pairs of torsion bars which the actuator in the sixth example is provided with.

FIG. 9 is an enlarged plane view illustrating one example of a detailed shape of plurality of pairs of torsion bars which the actuator in the seventh example is provided with.

FIG. 10 is an enlarged plane view illustrating one example of a detailed shape of plurality of pairs of torsion bars which the actuator in an eighth example is provided with.

FIG. 11 is a plan view illustrating one example of a configuration of an actuator in a ninth example.

FIG. 12 is a plan view illustrating one example of a configuration of an actuator in a tenth example.

DESCRIPTION OF EMBODIMENT

Hereinafter, an embodiment of the actuator will be explained in order.

An actuator in the embodiment is provided with: a movable part; a support part which supports the movable part; and a plurality of torsion bars (i) each of which connects the movable part and the support part along a long direction such that the movable part is capable of swinging around a rotational axis which is along the long direction and (ii) which are arranged along a short direction; the farther each torsion bar is from the rotational axis, the smaller a spring constant of each torsion bar is.

According to the actuator in the embodiment, the movable part which is suspended by the plurality of torsion bars swings. The movable part may rotate such that an axis in a direction along which each of the plurality of torsion bars extends (namely, the long direction of each of the plurality of torsion bars) becomes the rotational axis.

In order to realize such a rotation of the movable part, each of the plurality of torsion bars connects the movable part and the support part along the long direction of each torsion bar. In this case, each of the plurality of torsion bars may connect the movable part and the support part directly. Alternatively, each of the plurality of torsion bars may connect the movable part and the support part indirectly (in other words, while arbitrary element intermediates therebetween). In addition, the plurality of torsion bars are arranged along the short direction of the plurality of torsion bars (in other words, are lined in parallel). In other words, the plurality of torsion bars are arranged along a direction which is perpendicular to the rotational axis of the movable part.

In the present embodiment, the spring constants of the plurality of torsion bars are adjusted on the basis of a distance between the rotational axis of the movable part and each of the plurality of torsion bars. More specifically, the spring constants of the plurality of torsion bars are adjusted such that the farther each torsion bar is from the rotational axis (namely, the larger a distance from the rotational axis to each torsion bar is) the smaller the spring constant of each torsion bar is. In other words, the spring constants of the plurality of torsion bars are adjusted such that the spring constant of each torsion bar is smaller as each torsion bar is farther from the rotational axis. In other words more, the spring constants of the plurality of torsion bars are adjusted such that the spring constant of the torsion bar which is relatively far from the rotational axis is smaller than the spring constant of the torsion bar which is relatively close to the rotational axis. Incidentally, if the midmost torsion bar among the plurality of torsion bars is located on the rotational axis, one can argue that the spring constants of the plurality of torsion bars are adjusted such that the spring constant of the torsion bar which is located on a relatively outer side in the arrangement along the short direction is smaller than the spring constant of the torsion bar which is located on a relatively center side in the arrangement along the short direction.

Here, a stress which is added to the torsion bar in the case where the movable part is supported by only one torsion bar which is located on the rotational axis and this movable part swings will be explained. When such a movable part swings, the stress which is added to both edge portion of the only one torsion bar (more specifically, both edge portion along the short direction of the torsion bar) is larger than the stress which is added to center portion of the only one torsion bar (more specifically, center portion along the short direction of the torsion bar). Namely, the stress which is added to the edge portion of the only one torsion bar which is relatively far from the rotational axis is larger than the stress which is added to the center portion of the only one torsion bar which is relatively close to the rotational axis. Namely, the stress which is added to the only one torsion bar due to the swing of the movable part is more likely added to the portion as the portion is farther from the rotational axis.

Considering the added manner of the stress, in the actuator in the embodiment which is provided with the plurality of torsion bars in which the farther each torsion bar is from the rotational axis the smaller a spring constant of each torsion bar is, the stress is more likely added to the torsion bar which is relatively far from the rotational axis (namely, the torsion bar whose spring constant is relatively small). However, due to the relative smallness of the spring constant, the stress which is added to the torsion bar which is relatively far from the rotational axis lessens. Thus, the destruction of the torsion bar which is relatively far from the rotational axis is appropriately prevented or suppressed. On the other hand, too much stress is not added to the torsion bar which is relatively close to the rotational axis (namely, the torsion bar whose spring constant is relatively large). Thus, the destruction of the torsion bar which is relatively close to the rotational axis is appropriately prevented or suppressed, too. Therefore, according to the actuator in the embodiment which is provided with the plurality of torsion bars whose spring constants are adjusted on the basis of the distance from the rotational axis, the destruction of the plurality of the torsion bars is appropriately prevented or suppressed.

On the other hand, the spring constant of the whole of the plurality of the torsion bars can be relatively enlarged, because the spring constant of the torsion bar which is relatively close to the rotational axis can be enlarged. As a result, the swing frequency of the movable part which is determined by the spring constant of the whole of the plurality of the torsion bars can be relatively enlarged.

Namely, the actuator in the embodiment is capable of enlarging the swing frequency of the movable part while preventing or suppressing the destruction of the plurality of torsion bars.

Incidentally, in order to adjust the spring constants of each of the plurality of torsion bars on the basis of the distance from the rotational axis, as described later, widths or lengths of the plurality of torsion bars may be adjusted. Alternatively, in order to adjust the spring constants of each of the plurality of torsion bars on the basis of the distance from the rotational axis, as described later, densities of the plurality of torsion bars may be adjusted. Specifically, the farther each torsion bar is from the rotational axis, the smaller a density of each torsion bar is. The adjustment of the density of each of the plurality of the torsion bars may be realized by the presence or absence of a hole which is formed in each of the plurality of the torsion bars. Specifically, the density of the plurality of the torsion bars may be adjusted by forming one or more hole in the torsion bar which is relatively far from the rotational axis and by not forming one or more hole in the torsion bar which is relatively close to the rotational axis. Alternatively, the adjustment of the density of each of the plurality of the torsion bars may be realized by the number of the hole(s) which is (are) formed in each of the plurality of torsion bars. Specifically, the density of the plurality of the torsion bars may be adjusted by forming a relatively large number of holes in the torsion bar which is relatively far from the rotational axis and by forming a relatively small number of hole(s) or not forming the hole in the torsion bar which is relatively close to the rotational axis. Alternatively, the adjustment of the density of each of the plurality of the torsion bars may be realized by a size of the hole(s) which is (are) formed in each of the plurality of torsion bars. Specifically, the density of the plurality of the torsion bars may be adjusted by forming a relatively large hole(s) in the torsion bar which is relatively far from the rotational axis and by forming a relatively small hole(s) or not forming the hole in the torsion bar which is relatively close to the rotational axis. Alternatively, the adjustment of the density of each of the plurality of the torsion bars may be realized by difference in material which composes each of the plurality of torsion bars. Specifically, the density of the plurality of the torsion bars may be adjusted by composing the torsion bar which is relatively far from the rotational axis with a material whose density is relatively small and by composing the torsion bar which is relatively close to the rotational axis with a material whose density is relatively large.

Moreover, all of the plurality of torsion bars may be completely separated from each other. One portion of the plurality of torsion bars may be coupled with another neighboring torsion bar by a bridge which is along the short direction.

Incidentally, even in the case where the movable part is supported by only one torsion bar, it may be supposed that the swing frequency of the movable part can be enlarged while the destruction of the torsion bar is prevented or suppressed by adjusting a thickness of the torsion bar (specifically, the thickness along a direction which is perpendicular both of the long and short directions of the torsion bar). In this case, in order to enlarge the swing frequency of the movable part while preventing or suppressing the destruction of the torsion bar, it is preferable that the thickness of the torsion bar be enlarged. However, as described later, the movable part, the support part and the torsion bar may be likely manufactured from a common (in other words, single) semiconductor substrate by using a semiconductor manufacturing process. Thus, in order to enlarge the thickness of the torsion bar, the thickness of the movable part and the support part also needs to be enlarged. Furthermore, as described later in detail, the thickness of the torsion bar whose spring constant is not desired to be enlarged also needs to be enlarged. However, according to the present embodiment, it is possible to enlarge the swing frequency of the movable part while preventing or suppressing the destruction of the plurality of torsion bars, without changing a specification of the movable part and the support part. Thus, the actuator in the embodiment which is provided with the plurality of torsion bars whose spring constants are adjusted on the basis of the distance from the rotational axis is practically advantageous, in comparison with an actuator in which the thickness of the torsion bar is adjusted.

In an another aspect of the actuator in the present embodiment, the farther each torsion bar is from the rotational axis, the smaller a width of each torsion bar is.

According to this aspect, the plurality of torsion bars whose spring constants are adjusted on the basis of the distance from the rotational axis can be realized relatively easily, by adjusting the width of each of the plurality of torsion bars.

In an another aspect of the actuator in the present embodiment, the farther each torsion bar is from the rotational axis, the larger a length of each torsion bar is.

According to this aspect, the plurality of torsion bars whose spring constants are adjusted on the basis of the distance from the rotational axis can be realized relatively easily, by adjusting the length of each of the plurality of torsion bars.

In the aspect of the actuator in which the farther each torsion bar is from the rotational axis the larger a length of each torsion bar is as described above, it may be configured that at least one of the plurality of torsion bars has such a bending shape that the at least one of the plurality of torsion bars bends at least once or more toward a direction which intersects a direction along which at least one of the plurality of torsion bars extends from the support part to the movable part.

By virtue of such a configuration, the length of the at least one torsion bar can be enlarged by setting the shape of the at least one torsion bar to the bending shape. Therefore, the length of each of the plurality of the torsion bars can be adjusted relatively easily.

Incidentally, as one example of the bending shape in which the torsion bar bends, for example, a shape in which the torsion bar extends to return to an original direction after extending toward a different direction with respect to the original direction along which the torsion bar extends from the support part to the movable part (namely, the long direction of the torsion bar or the direction along the rotational axis), a shape in which the torsion bar extends tortuously, a shape in which the torsion bar extends in a zig-zag manner, and the like are listed.

In the aspect of the actuator in which the at least one torsion bar has the bending shape as described above, it may be configured that at least one of the other torsion bars other than one or two torsion bar which is located on the rotational axis or is closest to the rotational axis among the plurality of torsion bars has the bending shape, and one or two torsion bars which is closest to the rotational axis among the plurality of torsion bars does not have the bending shape.

By virtue of such a configuration, since the one or two torsion bar which is closest to the rotational axis does not have the bending shape, the swing of the movable part (for example, the swing to rotate) can be realized by the one or two torsion bar. Namely, the swing of the movable part can be realized while adjusting the lengths of the plurality of torsion bars on the basis of the distance from the rotational axis by setting the shape of the at least one torsion bar to the bending shape.

Incidentally, the one or two torsion bar which is closest to the rotational axis may have a shape which passes the shortest path from the support part toward the movable part (alternatively, from a connecting point at which the support part is connected to the torsion bar toward a connecting point at which the movable part is connected to the torsion bar).

In the aspect of the actuator in which the farther each torsion bar is from the rotational axis the larger a length of each torsion bar is as described above, it may be configured that at least one of the plurality of torsion bars has such a turning shape that the at least one of the plurality of torsion bars turns around at least once or more toward a direction which is opposite to a direction along which at least one of the plurality of torsion bars extends from the support part to the movable part.

By virtue of such a configuration, the length of the at least one torsion bar can be enlarged by setting the shape of the at least one torsion bar to the turning shape. Therefore, the length of each of the plurality of the torsion bars can be adjusted relatively easily.

Incidentally, as one example of the turning shape in which the torsion bar turns around, for example, a shape in which the torsion bar extends along the original direction along which the torsion bar extends from the support part to the movable part (namely, the long direction of the torsion bar or the direction along the rotational axis) bends (i.e. turns around) at an angle of 90 or more degree with respect to the above original direction.

In the aspect of the actuator in which the at least one torsion bar has the turning shape as described above, it may be configured that at least one of the other torsion bars other than one or two torsion bar which is located on the rotational axis or is closest to the rotational axis among the plurality of torsion bars has the turning shape, and one or two torsion bars which is closest to the rotational axis among the plurality of torsion bars does not have the turning shape.

By virtue of such a configuration, since the one or two torsion bar which is closest to the rotational axis does not have the turning shape, the swing of the movable part (for example, the swing to rotate) can be realized by the one or two torsion bar. Namely, the swing of the movable part can be realized while adjusting the lengths of the plurality of torsion bars on the basis of the distance from the rotational axis by setting the shape of the at least one torsion bar to the turning shape.

Incidentally, the one or two torsion bar which is closest to the rotational axis may have a shape which passes the shortest path from the support part toward the movable part (alternatively, from a connecting point at which the support part is connected to the torsion bar toward a connecting point at which the movable part is connected to the torsion bar).

In an another aspect of the actuator in the present embodiment, the farther each torsion bar is from the rotational axis, the smaller a density of each torsion bar is.

According to this aspect, the plurality of torsion bars whose spring constants are adjusted on the basis of the distance from the rotational axis can be realized relatively easily, by adjusting the density of each of the plurality of torsion bars.

In the aspect of the actuator in which the farther each torsion bar is from the rotational axis the smaller a density of each torsion bar is as described above, it may be configured that one or more hole is formed in at least one of the plurality of torsion bars.

By virtue of such a configuration, the density of at least one torsion bar can be lessened by forming the hole in the at least one torsion bar. Therefore, the density of each of the plurality of torsion bars can be adjusted relatively easily.

Incidentally, the "hole" in the present embodiment may be a hole (what we call an aperture) which penetrates the torsion bar, may be a hole (what we call a concave portion) which does not penetrate the torsion bar, or may be a hole (what we call a space) which is formed inside the torsion bar (in other words, not so as to appear in the outside).

These operation and other advantages in the embodiment will become more apparent from the examples explained below.

As explained above, the actuator in the embodiment is provided with: the movable part; the support part; and the plurality of torsion bars, the farther each torsion bar is from the rotational axis, the smaller a spring constant of each torsion bar is. Therefore, the swing frequency of the movable part can be enlarged while the destruction of the torsion bar prevented or suppressed.

EXAMPLES

Hereinafter, with reference to the drawings, examples will be explained.

(1) First Example

Hereinafter, with reference to FIG. 1, an actuator 1 in a first example will be explained. FIG. 1 is a plan view illustrating one example of the configuration of the actuator 1 in the first example.

As illustrated in FIG. 1, the actuator 1 in the first example is a planar type electro-magnetic driving actuator (namely, a MEMS scanner) which is used to scan laser light. The actuator 1 is provided with: an outer support body 110, a pair of torsion bars 130, an inner support body 210, a plurality of pairs of torsion bars 230, a movable part 120, a pair of permanent magnets 160 and a pair of supply terminals 170.

The outer support body 110, a pair of torsion bars 130, the inner support body 210, the plurality of pairs of torsion bars 230 and the movable part 120 are integrally formed from a non-magnetic substrate such as a silicon substrate, for example. Namely, the outer support body 110, a pair of torsion bars 130, the inner support body 210, the plurality of pairs of torsion bars 230 and the movable part 120 are formed by removing one portion of the non-magnetic substrate such as the silicon substrate and thus forming a space, for example. A MEMS process is preferably used as a forming process in this case. Incidentally, the outer support body 110, a pair of torsion bars 130, the inner support body 210, the plurality of pairs of torsion bars 230 and the movable part 120 may be integrally formed from an arbitrary elastic material, instead of the silicon substrate.

The outer support body 110 has a frame shape which surrounds the inner support body 210. The outer support body 110 is coupled with the inner support body 210 by a pair of torsion bars 130 which is located on both sides of the inner support body 210 (in other words, a pair of torsion bars 130 by which the inner support body 210 is sandwiched from both sides of the inner support body 210). Incidentally, FIG. 1 illustrates an example in which the shape of the outer support body 110 is the frame shape. However, it goes without saying that the shape of the outer support body 110 is not limited to the frame shape. For example, the shape of the outer support body 110 may be a frame shape whose one portion is open.

The inner support body 210 has a frame shape which surrounds the movable part 120. The inner support body 210 is supported by the outer support body 110 via a pair of torsion bars 130 so as to be capable of swinging around a rotational axis in a direction along which a pair of torsion bars 130 extends (namely, in a long direction of a pair of torsion bars 130, and a X axis direction in FIG. 1). The inner support body 210 is coupled with the movable part 120 by the plurality of pairs of torsion bars 230 which are located on both sides of the movable part 120 (in other words, the plurality of pairs of torsion bars 230 by which the movable part 120 is sandwiched from both sides of the movable part 120). A driving coil 140 is formed on a surface of the inner support body 210. However, the driving coil 140 may be formed in the inside of the inner support body 210. Incidentally, FIG. 1 illustrates an example in which the shape of the inner support body 210 is the frame shape. However, it goes without saying that the shape of the inner support body 210 is not limited to the frame shape. For example, the shape of the inner support body 210 may be a frame shape whose one portion is open.

The movable part 120 is supported by the inner support body 210 via the plurality of pairs of torsion bars 230 so as to be capable of swinging around a rotational axis in a direction along which the plurality of pairs of torsion bars 230 extends (namely, in a long direction of the plurality of pairs of torsion bars 230, and a Y axis direction in FIG. 1). Non-illustrated mirror which reflects a laser light is formed on a surface of the movable part 120.

A pair of torsion bars 130 connects the inner support body 210 and the outer support body 110 such that the inner support body 210 is capable of swinging with respect to the outer support body 110. The inner support body 210 swings by using the elasticity of a pair of torsion bars 130 such that an axis in a direction along which a pair of torsion bars 130 extends becomes the rotational axis. Namely, the inner support body 210 swings to rotate around the rotational axis which is the X axis in FIG. 1. In this case, the movable part 120 is connected to the inner support body 210 via the plurality of pairs of torsion bars 230. Therefore, the movable part 120 substantially swings to rotate the rotational axis which is the X axis in FIG. 1, due to the swing of the inner support body 210.

Each of the plurality of pairs of torsion bars 230 connects the inner support body 210 and the movable part 120 such that the movable part 120 is capable of swinging with respect to the inner support body 210. The movable part 120 swings by using the elasticity of the plurality of pairs of torsion bars 230 such that an axis in a direction along which the plurality of pairs of torsion bars 230 extend becomes the rotational axis. Namely, the movable part 120 swings to rotate around the rotational axis which is the Y axis in FIG. 1. In addition, the plurality of pairs of torsion bars 230 are arranged to line in parallel along a short direction of the torsion bars 230.

The driving coil 140 is a coil which extends on the inner support body 210, for example. The driving coil 140 may be made of a material (for example, gold, cupper or the like) whose electrical conductivity is relatively high. Moreover, the driving coil 140 may be formed by using a semiconductor manufacturing process such as a plating process, a sputtering process and the like. Alternatively, the driving coil 140 may be embedded, by using an implanting process, in a silicon substrate which is used to form the outer support body 110, a pair of torsion bars 130, the inner support body 210, the plurality of pairs of torsion bars 230 and the movable part 120.

Incidentally, in FIG. 1, the outline of the driving coil 140 is illustrated in a simplified manner for the purpose of improving the visualization of the drawing. However, the driving coil 140 is actually made of one or more winding formed on the surface of the inner support body 210.

Control current is supplied to the driving coil 140 from a power source via a pair of supply terminals 170 which is formed on the outer support body 110 and a wiring 150 which connects a pair of supply terminals 170 and the driving coil 140 and which is formed on a pair of torsion bars 130. The control current is a control current for swinging the inner support body 210 and the movable part 120. The control current is typically an alternating current which includes a signal component whose frequency is synchronized with a swing frequency of the inner support body 210 and a signal component whose frequency is synchronized with a swing frequency of the movable part 120. Incidentally, the power source may be a power source which the actuator 1 itself is provided with or may be a power source which is prepared outside of the actuator 1.

A pair of permanent magnets 160 is attached to the exterior of the outer support body 110. However, a pair of permanent magnets 160 may be attached to an arbitrary position as long as a pair of permanent magnets 160 is capable of applying static magnetic field to the driving coil 140. It is preferable that a direction of a magnetic pole of a pair of permanent magnets 160 be set appropriately such that a pair of permanent magnets 160 applies a predetermined static magnetic field to the driving coil 140. Incidentally, a yoke may be attached to a pair of permanent magnets 160 in order to improve intensity of static magnetic field.

When the actuator 1 in the first example operates (specifically, when the movable part 120 swings), firstly, the control current is supplied to the driving coil 140 via the supply terminals 170 and the wiring 150. In this case, the control current which is supplied to the driving coil 140 is preferably a current in which a signal for swinging the inner support body 210 (specifically, a signal which is synchronized with a cycle of the swing of the inner support body 210) and a signal for swinging the movable part 120 (specifically, a signal which is synchronized with a cycle of the swing of the movable part 120) are superimposed. On the other hand, the static magnetic field is applied to the driving coil 140 by a pair of permanent magnets 160. Therefore, a force (namely, Lorentz force) is generated in the driving coil 140 due to electromagnetic interaction between the static magnetic field applied from a pair of permanent magnets 160 and the control current supplied to the driving coil 140. As a result, the inner support body 210 on which the driving coil 140 is formed swings by the Lorentz force due to the electromagnetic interaction between the static magnetic field applied from a pair of permanent magnet 160 and the control current supplied to the driving coil 140. Namely, the inner support body 210 swings to rotate around the rotational axis which is the X axis in FIG. 1. Therefore, the movable part 120 substantially swings to rotate around the rotational axis which is the X axis in FIG. 1, due to the swing of the inner support body 210.

In addition, the Lorentz force due to the electromagnetic interaction between the static magnetic field applied from a pair of permanent magnets 160 and the control current supplied to the driving coil 140 is transmitted to the movable part 120 as a inertial force. As a result, the movable part 120 swings to rotate around the rotational axis which is the Y axis in FIG. 1.

As described above, according to the actuator 1 in the first example, the movable part 120 swings biaxially.

Incidentally, in the first example, the biaxial swing of the movable part 120 is realized by swinging the inner support body 210 due to the Lorentz force itself and by swinging the movable part 120 due to the Lorentz force used as the inertial force. However, the driving coil which is used to generate the Lorentz force for swinging the movable part 120 may be formed on the movable part 120. In this case, it is preferable that a wiring which connects the driving coil on the movable part 120 and the supply terminals 170 on the outer support body 110 be formed on the plurality of pairs of torsion bars 230 (furthermore, on the inner support body 210, a pair of torsion bars 130 and the outer support body 110).

Especially, in the first example, a width of each of the plurality of pairs of torsion bars 230 (specifically, a width corresponding to a length along the short direction of each of the plurality of pairs of torsion bars 230, and a width corresponding to a length in a direction along the X axis in FIG. 1) is adjusted on the basis of a distance between the rotational axis of the movable part 120 (hereinafter, if there is no notation, the "rotational axis" means the "rotational axis of the movable part 120 (namely, the rotational axis along the Y axis)") and each of the plurality of pairs of torsion bars 230. Hereinafter, with reference to FIG. 2, the width of each of the plurality of pairs of torsion bars 230 which is adjusted on the basis of the distance between the rotational axis of the movable part 120 and each of the plurality of pairs of torsion bars 230. FIG. 2 is an enlarged plane view illustrating one example of a detailed shape of plurality of pairs of torsion bars 230 which the actuator 1 in the first example is provided with. Incidentally, in FIG. 2, the explanation focusing on the torsion bars 230 which is located on one side (for example, an upper side in FIG. 1) of the movable part 120 among the plurality of pairs of torsion bars 230 will be given. However, same explanation can be applied to the torsion bars 230 which is located on the other side (for example, a lower side in FIG. 1) of the movable part 120 among the plurality of pairs of torsion bars 230 will be given.

As illustrated in FIG. 2, the width of each of the plurality of torsion bars 230 which are arranged along the short direction (the X axis direction) is adjusted such that the larger the distance between the torsion bar 230 and the rotational axis is, the smaller the width of the torsion bar 230 is. Namely, the width of each of the plurality of torsion bars 230 is adjusted such that the smaller the distance between the torsion bar 230 and the rotational axis is, the larger the width of the torsion bar 230 is. In other words, the width of each of the plurality of torsion bars 230 is adjusted such that the farther the torsion bar 230 is from the rotational axis, the smaller the width of the torsion bars 230 becomes. Namely, the width of each of the plurality of torsion bars 230 is adjusted such that the closer the torsion bar 230 is to the rotational axis, the larger the width of the torsion bars 230 becomes. In other words more, the width of each of the plurality of torsion bars 230 is adjusted such that the width of the torsion bar 230 becomes smaller as the torsion bar 230 is farther from the rotational axis. Namely, the width of each of the plurality of torsion bars 230 is adjusted such that the width of the torsion bar 230 becomes larger as the torsion bar 230 is closer to the rotational axis.

Specifically, as illustrated in FIG. 2, an example in which the plurality of torsion bars 230 includes (i) two torsion bars 230a whose distances from the rotational axis are D1, (ii) two torsion bars 230b whose distances from the rotational axis are D2 (D2<D1), and (iii) a torsion bar 230c which is located on the rotational axis (namely, whose distance from the rotational axis is zero) will be explained. In this case, the widths of the plurality of torsion bars 230 are adjusted such that a condition da<db<dc is satisfied wherein the width of the torsion bar 230a is da, the width of the torsion bar 230b is db and the width of the torsion bar 230c is dc.

Incidentally, FIG. 1 illustrates an example in which the torsion bar 230c which is located at the center among the plurality of torsion bars 230 is located on the rotational axis. In this case, the distance between the torsion bar 230 and the rotational axis depends on whether the torsion bar 230 is located on a relative center side or a relative outer side along the arrangement of the plurality of the torsion bars 230. Therefore, when the torsion bar 230c which is located at the center of the plurality of torsion bars 230 is located on the rotational axis, the width of each of the plurality of torsion bars 230 is adjusted such that the width of the torsion bar 230 (for example, the torsion bar 230a) which is located on the relative outer side along the arrangement in the short direction is smaller than the width of the torsion bar 230 (for example, the torsion bar 230c) which is located on the relative center side along the arrangement in the short direction. Namely, one can argue that the width of each of the plurality of torsion bars 230 is adjusted such that the width of the torsion bar 230 becomes smaller as the torsion bar 230 is located on more outer side along the arrangement in the short direction.

Incidentally, it is preferable that the plurality of torsion bars 230 be arranged in a liner symmetric manner with respect to the rotational axis of the movable part 120. In this case, if the actuator 1 is provided with an odd number of torsion bars 230, it is preferable that the torsion bar 230 which is the center among an odd number of torsion bars 230 be located on the rotational axis. Alternatively, if the actuator 1 is provided with an even number of torsion bars 230, it is preferable that two torsion bars 230 which are the center among an even number of torsion bars 230 be located in a line symmetric manner with respect to the rotational axis.

Here, the smaller the width of the torsion bar 230, the smaller a spring constant of the torsion bar 230 is. In other words, the larger the width of the torsion bar 230, the larger the spring constant of the torsion bar 230 is. Thus, according to the actuator 1 in the first example, by adjusting the width of each of the plurality of torsion bars 230, the larger the distance between each torsion bar 230 and the rotational axis is, the smaller the spring constant of each torsion bar 230 is. In other words, the smaller the distance between each torsion bar 230 and the rotational axis is, the larger the spring constant of each torsion bar 230 is. In other words, the farther each torsion bar 230 is from the rotational axis, the smaller the spring constant of each torsion bar 230 is. Namely, the width of each of the plurality of torsion bar 230 is adjusted such that the closer each torsion bar 230 is to the rotational axis, the larger the spring constant of each torsion bar 230 is. In other words more, the width of each of the plurality of torsion bars 230 is adjusted such that the spring constant of each torsion bar 230 becomes smaller as each torsion bar 230 is farther from the rotational axis. Namely, the width of each of the plurality of torsion bars 230 is adjusted such that the spring constant of the torsion bars 230 becomes larger as the torsion bar 230 is closer to the rotational axis.

Here, with reference to FIG. 3, an actuator in a comparative example which rotates the movable part 120 by using only one torsion bar 1230 located on the rotational axis will be explained, in order to explain the technical effect of the actuator 1 in the first example which is provided with the plurality of torsion bars 230 whose widths are adjusted on the basis of the distance from the rotational axis. FIG. 3 is an enlarged plan view illustrating one example of a configuration of the actuator in the comparative example which rotates the movable part 12 by using only one torsion bar 1230 located on the rotational axis.

As illustrated in FIG. 3, in the comparative example, when the movable part 120 swings, the stress which is added to both edge portions of the torsion bar 1230 (more specifically, both edge portions along the short direction of the torsion bar 1230, and edge portions on right and left sides in FIG. 3) is larger than the stress which is added to center portion of the torsion bar 1230 (more specifically, center portion along the short direction of the torsion bar 1230). Namely, the stress which is added to the edge portion of the torsion bar 1230 which is relatively far from the rotational axis is larger than the stress which is added to the center portion of the torsion bar 1230 which is relatively close to the rotational axis. Namely, the stress which is added to the torsion bar 1230 due to the swing of the movable part 120 is more likely added to the portion as the portion is farther from the rotational axis.

Considering the added manner of the stress, in the actuator 1 in the first example which is provided with the plurality of torsion bars 230 whose widths are smaller (namely, whose spring constants are smaller) as the torsion bar 230 is farther from the rotational axis, the stress is more likely added to the torsion bar 230 which is relatively far from the rotational axis (namely, the torsion bar 230 whose width is relatively small, and the torsion bar 230 whose spring constant is relatively small). However, due to the relative smallness of the spring constant caused by the relative smallness of the width, the stress which is added to the torsion bar 230 which is relatively far from the rotational axis lessens. In other words, due to the relative smallness of the spring constant caused by the relative smallness of the width, the torsion bar 230 which is relatively far from the rotational axis softens relatively, and as a result, the stress which is added to the torsion bar 230 which is relatively far from the rotational axis lessens. Thus, the destruction of the torsion bar 230 which is relatively far from the rotational axis is appropriately prevented or suppressed.

On the other hand, too much stress is not added to the torsion bar 230 which is relatively close to the rotational axis (namely, the torsion bar whose width is relatively large, and the torsion bar whose spring constant is relatively large). Thus, the destruction of the torsion bar 230 which is relatively close to the rotational axis is appropriately prevented or suppressed, too. In other words, due to the relative largeness of the spring constant caused by the relative largeness of the width, the torsion bar 230 which is relatively far from the rotational axis hardens relatively. However, the destruction of the torsion bar 230 which is relatively close to the rotational axis is appropriately prevented or suppressed, because too much stress is not added to the torsion bar 230 which is relatively close to the rotational axis.

As described above, according to the actuator 1 in the first example, the destruction of the plurality of the torsion bars 230 is appropriately prevented or suppressed, because the widths (alternatively, the spring constants) of the plurality of torsion bars 230 are adjusted on the basis of the distance from the rotational axis.

In addition, according to the actuator 1 in the first example, the width of the torsion bar 230 which is relatively close to the rotational axis can be relatively enlarged (namely, the spring constant can be relatively enlarged), while the destruction of the plurality of the torsion bars 230 is prevented or suppressed. Incidentally, in the actuator in the comparative example illustrated in FIG. 3, although the spring constant of the torsion bar 1230 can be enlarged by thickening the width of the torsion bar 1230, the torsion bar 1230 is likely destructed by a degree of thickening the torsion bar 1230. However, according to the actuator 1 in the first example, the width of the torsion bar 230 which is relatively far from the rotational axis can be lessened and the width of the torsion bar 230 which is relatively close to the rotational axis can be enlarged while the destruction of the plurality of the torsion bars 230 is prevented or suppressed, on the basis of the consideration of such a trade-off relationship between the destruction of the torsion bar 230 and the largeness of the spring constant of the torsion bar 230. Thus, the spring constant of the whole of the plurality of the torsion bars 230 can be relatively enlarged. As a result, the swing frequency of the movable part 120 which is determined by the spring constant of the whole of the plurality of the torsion bars 230 can be relatively enlarged. Especially, if the actuator 1 in the first example is used as the image display apparatus such as a head-up display and the like, it is anticipated that a vertical scanning is realized by the swing due to the elasticity of a pair of torsion bars 130 (namely, the swing around the X axis as the rotational axis) and a horizontal scanning is realized by the swing due to the elasticity of the plurality of pairs of torsion bars 230 (namely, the swing around the Y axis as the rotational axis). In this case, in order to improve a resolution of the image, it is preferable that a frequency of the swing due to the elasticity of the plurality of pairs of torsion bars 230 (namely, the swing around the Y axis as the rotational axis) be enlarged. Therefore, according to the actuator 1 in the first example, since the spring constant of whole of the plurality of pairs of torsion bars 230 can be enlarged, the frequency of the swing due to the elasticity of the plurality of pairs of torsion bars 230 (namely, the swing around the Y axis as the rotational axis) can be enlarged. As a result, a swing frequency of the movable part 120 which swings due to the elasticity of the plurality of pairs of torsion bars 230 can be enlarged.

As described above, according to the actuator 1 in the first example, the swing frequency of the movable part 120 can be enlarged while the destruction of the plurality of torsion bars 230 is prevented or suppressed.

Incidentally, the actuator 1 may be provided with a plurality of pairs of torsion bars 130 (namely, torsion bars which are similar to the plurality of pairs of torsion bars 230) whose widths are adjusted on the basis of a distance from a rotational axis of the inner support body 210, instead of a pair of torsion bars 130. Namely, the actuator 1 may be provided with the plurality of pairs of torsion bars 130 in which the farther each torsion bar 130 is from the rotational axis of the inner support body 210 the smaller the width of each torsion bar 130 is, instead of a pair of torsion bars 130. Alternatively, if the actuator 1 may be provided with the plurality of pairs of torsion bars 130 whose widths are adjusted on the basis of a distance from a rotational axis of the inner support body 210, the actuator 1 may be provided with a pair of torsion bars 230 (namely, torsion bars which are similar to a pair of torsion bars 130), instead of the plurality of torsion bars 230 whose widths are adjusted on the basis of the distance from the rotational axis of the movable part 120.

(2) Second Example

Next, with reference to FIG. 4, an actuator 2 in a second example will be explained. FIG. 4 is an enlarged plane view illustrating one example of a detailed shape of plurality of pairs of torsion bars 230 which the actuator 2 in the second example is provided with. Incidentally, the same composing element as that of the actuator 1 in the first example described above will carry the same reference numeral, and the detailed explanation thereof will be omitted.

As illustrated in FIG. 4, the actuator 2 in the second example is different from the actuator 1 in the first example in that lengths of the plurality of pairs of torsion bars 230 (specifically, lengths along the long direction of each of the plurality of pairs of torsion bars 230) are adjusted on the basis of the distance from the rotational axis instead of the adjustment of the widths of the plurality of pairs of torsion bars 230 on the basis of the distance from the rotational axis. Another composing element of the actuator 2 in the second example may be same as another composing element of the actuator 1 in the first example.

Specifically, as illustrated in FIG. 4, in the second example, the length of each of the plurality of torsion bars 230 which are arranged along the short direction (the X axis direction) is adjusted such that the larger the distance between the torsion bar 230 and the rotational axis is, the larger the length of the torsion bar 230 is. Namely, the length of each of the plurality of torsion bars 230 is adjusted such that the smaller the distance between the torsion bar 230 and the rotational axis is, the smaller the length of the torsion bar 230 is. In other words, the length of each of the plurality of torsion bars 230 is adjusted such that the farther the torsion bar 230 is from the rotational axis, the larger the length of the torsion bars 230 becomes.

Namely, the length of each of the plurality of torsion bars 230 is adjusted such that the closer the torsion bar 230 is to the rotational axis, the smaller the length of the torsion bars 230 becomes. In other words more, the length of each of the plurality of torsion bars 230 is adjusted such that the length of the torsion bar 230 becomes larger as the torsion bar 230 is farther from the rotational axis. Namely, the length of each of the plurality of torsion bars 230 is adjusted such that the length of the torsion bar 230 becomes smaller as the torsion bar 230 is closer to the rotational axis.

Specifically, as illustrated in FIG. 4, an example in which the plurality of torsion bars 230 includes (i) two torsion bars 230a whose distances from the rotational axis are D1, (ii) two torsion bars 230b whose distances from the rotational axis are D2 (D2<D1), and (iii) a torsion bar 230c which is located on the rotational axis (namely, whose distance from the rotational axis is zero) will be explained. In this case, the lengths of the plurality of torsion bars 230 are adjusted such that a condition La>Lb>Lc is satisfied wherein the length of the torsion bar 230a is La, the length of the torsion bar 230b is Lb and the length of the torsion bar 230c is Lc.

Incidentally, when the torsion bar 230c which is the center is located on the rotational axis, one can argue that the length of each of the plurality of torsion bars 230 is adjusted such that the length of the torsion bar 230 (for example, the torsion bar 230a) which is located on the relative outer side along the arrangement in the short direction is larger than the length of the torsion bar 230 (for example, the torsion bar 230c) which is located on the relative center side along the arrangement in the short direction.

Here, the larger the length of the torsion bar 230, the smaller the spring constant of the torsion bar 230 is. In other words, the smaller the length of the torsion bar 230 is, the larger the spring constant of the torsion bar 230 is. Thus, according to the actuator 2 in the second example, by adjusting the length of each of the plurality of torsion bars 230, the larger the distance between each torsion bar 230 and the rotational axis is, the smaller the spring constant of each torsion bar 230 is. Therefore, even the actuator 2 in the second example can enjoy various effects which the actuator 1 in the first example can enjoy.

(3) Third Example

Next, with reference to FIG. 5, an actuator 3 in a third example will be explained. FIG. 5 is an enlarged plane view illustrating one example of a detailed shape of plurality of pairs of torsion bars 230 which the actuator 3 in the third example is provided with. Incidentally, the same composing element as that of the actuator 1 in the first example to the actuator 2 in the second example described above will carry the same reference numeral, and the detailed explanation thereof will be omitted.

As illustrated in FIG. 5, the actuator 3 in the third example is different from the actuator 1 in the first example in that the lengths of the plurality of pairs of torsion bars 230 (specifically, lengths along the long direction of each of the plurality of pairs of torsion bars 230) are adjusted on the basis of the distance from the rotational axis in addition to the adjustment of the widths of the plurality of pairs of torsion bars 230 on the basis of the distance from the rotational axis. Namely, the actuator 3 in the third example corresponds to an actuator which is obtained by combining the composing element of the actuator 1 in the first example with the composing element of the actuator 2 in the second example. Another composing element of the actuator 3 in the third example may be same as another composing element of the actuator 1 in the first example.

Even the actuator 3 in the third example can enjoy various effects which the actuator 1 in the first example and the actuator 2 in the second example can enjoy. Especially, according to the actuator 3 in the third example, since both of the widths and lengths of the plurality of torsion bars 230 are adjusted, the spring constants of the plurality of torsion bars 230 can be adjusted more accurately.

(4) Fourth Example

Next, with reference to FIG. 6, an actuator 4 in a fourth example will be explained. FIG. 6 is an enlarged plane view illustrating one example of a detailed shape of plurality of pairs of torsion bars 230 which the actuator 4 in the fourth example is provided with. Incidentally, the same composing element as that of the actuator 1 in the first example to the actuator 3 in the third example described above will carry the same reference numeral, and the detailed explanation thereof will be omitted.

As illustrated in FIG. 6, the actuator 4 in the fourth example is different from the actuator 1 in the first example in that the plurality of torsion bar 230 have such a shape that each of the plurality of torsion bar 230 cuts into both of the movable part 120 and the inner support body 210. Another composing element of the actuator 4 in the fourth example may be same as another composing element of the actuator 1 in the first example.

More specifically, a cut for adjusting the length of each of the plurality of torsion bars 230 is formed on an area portion on the movable part 120 at which the movable part 120 is coupled with each of the plurality of torsion bars 230. Namely, in the fourth example, an area portion which corresponds to one portion of the movable part 120 in the second and third examples is regarded as an area portion which corresponds to one portion of the plurality of torsion bars 230 (namely, an area portion for enlarging the lengths of the plurality of torsion bars 230).

Similarly, a cut for adjusting the length of each of the plurality of torsion bars 230 is formed on an area portion on the inner support body 210 at which the inner support body 210 is coupled with each of the plurality of torsion bars 230. Namely, in the fourth example, an area portion which corresponds to one portion of the inner support body 210 in the second and third examples is regarded as an area portion which corresponds to one portion of the plurality of torsion bars 230 (namely, an area portion for enlarging the lengths of the plurality of torsion bars 230).

Even the actuator 4 in the fourth example can enjoy various effects which the actuator 2 in the second example can enjoy. Especially, the actuator 4 in the fourth example does not necessarily have such a shape (see shapes of inner support body 210 and the movable part 120 in FIG. 4 and FIG. 5) that the inner support body 210 and the movable part 120 project or are pulled out toward the plurality of torsion bars 230 in order to adjust the lengths of the plurality of torsion bars 230.

Incidentally FIG. 6 explains the actuator 4 which has such a shape that the each of the plurality of torsion bar 230 cuts into both of the movable part 120 and the inner support body 210. However, the actuator 4 may have such a shape that at least one of the plurality of torsion bar 230 cuts into at least one of the movable part 120 and the inner support body 210.

(5) Fifth Example

Next, with reference to FIG. 7, an actuator 5 in a fifth example will be explained. FIG. 7 is an enlarged plane view illustrating one example of a detailed shape of plurality of pairs of torsion bars 230 which the actuator 5 in the fifth example is provided with. Incidentally, the same composing element as that of the actuator 1 in the first example to the actuator 4 in the fourth example described above will carry the same reference numeral, and the detailed explanation thereof will be omitted.

As illustrated in FIG. 7, the actuator 5 in the fifth example is different from the actuator 2 in the second example in that at least one portion of the plurality of torsion bars 230 extends not only along a direction (the Y axis direction in FIG. 7) heading from the inner support body 210 to the movable part 120 but also along a direction (the X axis direction in FIG. 7) which intersects with (bends from) the above former direction. Another composing element of the actuator 5 in the fifth example may be same as another composing element of the actuator 2 in the second example.

Incidentally, FIG. 7 illustrates an example in which the actuator 5 is provided with an odd number of torsion bars 230. In this case, it is preferable that one torsion bar 230c which is the center among an odd number of torsion bars 230 extend along only the direction heading from the inner support body 210 to the movable part 120. Namely, it is preferable that one torsion bar 230c which is the center among an odd number of torsion bars 230 do not extend along the direction which intersects with (bends from) the direction heading from the inner support body 210 to the movable part 120. Incidentally, FIG. 7 illustrates an example in which one torsion bar 230c which is the center among the plurality of torsion bars 230 is located on the rotational axis. However, if one torsion bar 230 which is the center among the plurality of torsion bars 230 is located away from the rotational axis, it is preferable that one torsion bar 230 which is the closest to the rotational axis extend along only the direction heading from the inner support body 210 to the movable part 120. Alternatively, if the torsion bar 230 which is the center among the plurality of torsion bars 230 is located away from the rotational axis, it is preferable that at least two torsion bars 230 which are the closest to the rotational axis and which are located in a liner symmetric manner with respect to the rotational axis extend along only the direction heading from the inner support body 210 to the movable part 120.

Even the actuator 5 in the fifth example can enjoy various effects which the actuator 2 in the second example can enjoy. Especially, according to the actuator 5 in the fifth example, the lengths of the plurality of torsion bars 230 can be adjusted appropriately while an increase of a space which the plurality of torsion bars 230 occupy can be suppressed.

In addition, according to the actuator 5 in the fifth example, one torsion bar 230 which is located on the rotational axis or is the closest to the rotational axis does not bend. Thus, whole of the plurality of torsion bars 230 can be hardened in a direction other than a rotational direction of the movable part 120 due to the existence of the torsion bar 230 which does not bend. However, one torsion bar 230 which is located on the rotational axis or is the closest to the rotational axis may bend.

(6) Sixth Example

Next, with reference to FIG. 8, an actuator 6 in a sixth example will be explained. FIG. 8 is an enlarged plane view illustrating one example of a detailed shape of plurality of pairs of torsion bars 230 which the actuator 6 in the sixth example is provided with. Incidentally, the same composing element as that of the actuator 1 in the first example to the actuator 5 in the fifth example described above will carry the same reference numeral, and the detailed explanation thereof will be omitted.

As illustrated in FIG. 8, the actuator 6 in the sixth example is different from the actuator 5 in the fifth example in that the actuator 6 is provided with an even number of torsion bars 230. Another composing element of the actuator 6 in the sixth example may be same as another composing element of the actuator 5 in the fifth example.

In this case, it is preferable that two torsion bars 230c which are located at the center among an even number of torsion bars 230 extend along only the direction heading from the inner support body 210 to the movable part 120. Namely, it is preferable that two torsion bar 230c which are located at the center among an even number of torsion bars 230 do not extend along the direction which intersects with (bends from) the direction heading from the inner support body 210 to the movable part 120. Incidentally, FIG. 8 illustrates an example in which two torsion bars 230c which are the center among the plurality of torsion bars 230 are located at a position which is the closest to the rotational axis. However, if another torsion bar 230 different from two torsion bars 230 which are the center among the plurality of torsion bars 230 is located at the position which is the closest to the rotational axis, it is preferable that one torsion bar 230 which is the closest to the rotational axis extend along only the direction heading from the inner support body 210 to the movable part 120. Alternatively, if another torsion bar 230 different from two torsion bars 230 which are the center of the plurality of torsion bars 230 is located at the position which is the closest to the rotational axis, it is preferable that at least two torsion bars 230 which are the closest to the rotational axis and which are located in a liner symmetric manner with respect to the rotational axis extend along only the direction heading from the inner support body 210 to the movable part 120.

Even the actuator 6 in the sixth example can enjoy various effects which the actuator 5 in the fifth example can enjoy. In addition, according to the actuator 6 in the sixth example, even if the actuator 6 is provided with an even number of torsion bars 230, whole of the plurality of torsion bars 230 can be hardened in a direction other than a rotational direction of the movable part 120. However, two torsion bars 230 which are located on the rotational axis or are the closest to the rotational axis may bend.

(7) Seventh Example

Next, with reference to FIG. 9, an actuator 7 in a seventh example will be explained. FIG. 9 is an enlarged plane view illustrating one example of a detailed shape of plurality of pairs of torsion bars 230 which the actuator 7 in the seventh example is provided with. Incidentally, the same composing element as that of the actuator 1 in the first example to the actuator 6 in the sixth example described above will carry the same reference numeral, and the detailed explanation thereof will be omitted.

As illustrated in FIG. 9, the actuator 7 in the seventh example is different from the actuator 2 in the second example in that at least one portion of the plurality of torsion bars 230 extends not only along a direction (a direction from the upper side to the lower side in FIG. 9) heading from the inner support body 210 to the movable part 120 but also along a direction (a direction from the lower side to the upper side in FIG. 9) which is opposite to the above direction or a direction (a direction which turns around at an angle of 90 or more degree from the above direction, and a direction from the lower side to the upper side in FIG. 9) which turns around from the above former direction. Another composing element of the actuator 7 in the seventh example may be same as another composing element of the actuator 2 in the second example.

Incidentally, FIG. 9 illustrates an example in which the actuator 7 is provided with an odd number of torsion bars 230. Therefore, in the actuator 7 in the seventh example, it is preferable that one torsion bar 230 which is the closest to the rotational axis extend along only the direction heading from the inner support body 210 to the movable part 120, in the same manner as the actuator 5 in the fifth example. However, if the actuator 7 is provided with an even number of torsion bars 230, it is preferable that two torsion bar 230 which is the closest to the rotational axis extend along only the direction heading from the inner support body 210 to the movable part 120, in the same manner as the actuator 6 in the sixth example.

Even the actuator 7 in the seventh example can enjoy various effects which the actuator 2 in the second example can enjoy. Especially, according to the actuator 7 in the seventh example, the lengths of the plurality of torsion bars 230 can be adjusted while an increase of a space which the plurality of torsion bars 230 occupy can be suppressed.

In addition, according to the actuator 7 in the seventh example, one torsion bar 230 which is located on the rotational axis or is the closest to the rotational axis does not bend. Thus, whole of the plurality of torsion bars 230 can be hardened in a direction other than a rotational direction of the movable part 120 due to the existence of the torsion bar 230 which does not bend. However, one torsion bar 230 which is located on the rotational axis or is the closest to the rotational axis may bend.

(8) Eighth Example

Next, with reference to FIG. 10, an actuator 8 in an eighth example will be explained. FIG. 10 is an enlarged plane view illustrating one example of a detailed shape of plurality of pairs of torsion bars 230 which the actuator 8 in the eighth example is provided with. Incidentally, the same composing element as that of the actuator 1 in the first example to the actuator 7 in the seventh example described above will carry the same reference numeral, and the detailed explanation thereof will be omitted.

As illustrated in FIG. 10, the actuator 8 in the eighth example is different from the actuator 1 in the first example in that densities of the plurality of pairs of torsion bars 230 are adjusted on the basis of the distance from the rotational axis instead of the adjustment of the widths of the plurality of pairs of torsion bars 230 on the basis of the distance from the rotational axis. Another composing element of the actuator 8 in the eighth example may be same as another composing element of the actuator 1 in the first example.

Specifically, in the eighth example, the density of each of the plurality of torsion bars 230 which are arranged along the short direction (the X axis direction) is adjusted such that the larger the distance between the torsion bar 230 and the rotational axis is, the smaller the density of the torsion bar 230 is. Namely, the density of each of the plurality of torsion bars 230 is adjusted such that the smaller the distance between the torsion bar 230 and the rotational axis is, the larger the density of the torsion bar 230 is. In other words, the density of each of the plurality of torsion bars 230 is adjusted such that the farther the torsion bar 230 is from the rotational axis, the smaller the density of the torsion bars 230 becomes. Namely, the density of each of the plurality of torsion bars 230 is adjusted such that the closer the torsion bar 230 is to the rotational axis, the larger the density of the torsion bars 230 becomes. In other words more, the density of each of the plurality of torsion bars 230 is adjusted such that the density of the torsion bar 230 becomes smaller as the torsion bar 230 is farther from the rotational axis. Namely, the density of each of the plurality of torsion bars 230 is adjusted such that the density of the torsion bar 230 becomes larger as the torsion bar 230 is closer to the rotational axis.

In the eighth example, hole 231 is formed in at least one of the plurality of torsion bars 230, in order to adjust the density of each of the plurality of torsion bars 230. Incidentally, the hole 231 may be a hole 231 (what we call an aperture) which penetrates the torsion bar 230, may be a hole 231 (what we call a concave portion) which does not penetrate the torsion bar 230, or may be a hole 231 (what we call a space) which is formed inside the torsion bar 230 (in other words, not so as to appear in the outside). Especially, the larger the distance between each torsion bar 230 and the rotational axis, the smaller the number of the hole(s) 231 formed in each of the plurality of torsion bars 230 may be. Thus, the larger the distance between each torsion bar 230 and the rotational axis, the smaller the density of each of the plurality of torsion bars 230 is.

Here, the smaller the density of the torsion bar 230, the smaller the spring constant of the torsion bar 230 is. In other words, the larger the density of the torsion bar 230 is, the larger the spring constant of the torsion bar 230 is. Thus, according to the actuator 8 in the eighth example, by adjusting the density of each of the plurality of torsion bars 230, the larger the distance between each torsion bar 230 and the rotational axis is, the smaller the spring constant of each torsion bar 230 is. Therefore, even the actuator 8 in the eighth example can enjoy various effects which the actuator 1 in the first example can enjoy.

FIG. 10 illustrates an example in which the number of the hole(s) 231 formed in each of the plurality of torsion bars 230 becomes smaller as the distance between each torsion bar 230 and the rotational axis becomes larger and thus the density of the plurality of pairs of torsion bars 230 is adjusted on the basis of the distance from the rotational axis. However, a size (for example, a radius, a depth or the like) of the hole(s) 231 formed in each of the plurality of torsion bars 230 may become larger as the distance between each torsion bar 230 and the rotational axis becomes larger and thus the density of the plurality of pairs of torsion bars 230 may be adjusted on the basis of the distance from the rotational axis. Alternatively, the density of the plurality of pairs of torsion bars 230 may be adjusted on the basis of the distance from the rotational axis by varying a material of each of the plurality of torsion bars 230. Alternatively, the density of the plurality of pairs of torsion bars 230 may be adjusted on the basis of the distance from the rotational axis by using another method. In any case, various effects which the actuator 1 in the first example can enjoy can be enjoyed.

(9) Ninth Example

Next, with reference to FIG. 11, an actuator 9 in a ninth example will be explained. FIG. 11 is a plan view illustrating one example of the configuration of the actuator 9 in the ninth example. Incidentally, the same composing element as that of the actuator 1 in the first example to the actuator 8 in the eighth example described above will carry the same reference numeral, and the detailed explanation thereof will be omitted.

As illustrated in FIG. 11, the actuator 9 in the ninth example is different from the actuator 2 in the second example in that an extending aspects of the plurality of torsion bars 230 are different from each other. Another composing element of the actuator 9 in the ninth example may be same as another composing element of the actuator 2 in the second example.

Specifically, a torsion bar 232 which is relatively close to the rotational axis among the plurality of torsion bar 230 extends in a liner manner to head from the movable part 120 to the inner support body 210. On the other hand, a torsion bar 233 which is relatively far from the rotational axis among the plurality of torsion bar 230 extends in a curved manner or a broken line manner along an inner edge of the inner support body 210.

Even the actuator 9 in the ninth example can enjoy various effects which the actuator 2 in the second example can enjoy.

(10) Tenth Example

Next, with reference to FIG. 12, an actuator 10 in a tenth example will be explained. FIG. 12 is a plan view illustrating one example of the configuration of the actuator 10 in the tenth example. Incidentally, the same composing element as that of the actuator 1 in the first example to the actuator 9 in the ninth example described above will carry the same reference numeral, and the detailed explanation thereof will be omitted.

As illustrated in FIG. 12, the actuator 10 in the tenth example is different from the actuator 1 in the first example which swings the movable part 120 biaxially in that the actuator 10 swings the movable part 120 single-axially. Specifically, the actuator 10 is provided with: the outer support body 110, the plurality of pairs of torsion bars 230, the movable part 120, a pair of permanent magnet 160 and a pair of supply terminals 170. Namely, the actuator 10 in the tenth example is different from the actuator 1 in the first example in that the actuator 10 is not provided with a pair of torsion bars 130 and the inner support body 210.

The outer support body 110, the plurality of pairs of torsion bars 230 and the movable part 120 are integrally formed from a non-magnetic substrate such as a silicon substrate, for example. Namely, the outer support body 110, the plurality of pairs of torsion bars 230 and the movable part 120 are formed by removing one portion of the non-magnetic substrate such as the silicon substrate and thus forming a space, for example. A MEMS process is preferably used as a forming process in this case. Incidentally, the outer support body 110, the plurality of pairs of torsion bars 230 and the movable part 120 may be integrally formed from an arbitrary elastic material, instead of the silicon substrate.

The outer support body 110 has a frame shape which surrounds the movable part 120. The outer support body 110 is coupled with the movable part 120 by the plurality of pairs of torsion bars 230 which are located on both sides of the movable part 120 (in other words, the plurality of pairs of torsion bars 230 by which the movable part 120 is sandwiched from both sides of the movable part 120).

The movable part 120 is supported by the outer support body 110 via the plurality of pairs of torsion bars 230 so as to be capable of swinging around the rotational axis in a direction along which the plurality of pairs of torsion bars 230 extends (namely, in a long direction of the plurality of pairs of torsion bars 230, and a X axis direction in FIG. 12). Non-illustrated mirror which reflects the laser light is formed on the surface of the movable part 120. The driving coil 140 is formed on a surface of the movable part 120. However, the driving coil 140 may be formed in the inside of the movable part 120.

Each of the plurality of pairs of torsion bars 230 connects the outer support body 110 with the movable part 120 such that the movable part 120 is capable of swinging with respect to the outer support body 110. The movable part 120 swings by using the elasticity of the plurality of pairs of torsion bars 230 such that an axis in a direction along which the plurality of pairs of torsion bars 230 extend becomes the rotational axis. Namely, the movable part 120 swings to rotate around the rotational axis which is the X axis in FIG. 12.

The control current is supplied to the driving coil 140 from the power source via a pair of supply terminals 170 which is formed on the outer support body 110 and the wiring 150 which connects a pair of supply terminals 170 and the driving coil 140 and which is formed on the plurality of pairs of torsion bars 230. The control current is a control current for swinging the movable part 120. The control current is typically an alternating current which includes the signal component whose frequency is synchronized with the swing frequency of the movable part 120. Incidentally, the power source may be the power source which the actuator 10 itself is provided with or may be the power source which is prepared outside of the actuator 10.

When the actuator 10 in the tenth example operates (specifically, when the movable part 120 swings), firstly, the control current is supplied to the driving coil 140 via the supply terminals 170 and the wiring 150. In this case, the control current which is supplied to the driving coil 140 is preferably a current including the signal for swinging the movable part 120 (specifically, the signal which is synchronized with the cycle of the swing of the movable part 120). On the other hand, the static magnetic field is applied to the driving coil 140 by a pair of permanent magnets 160.

Therefore, the force (namely, Lorentz force) is generated in the driving coil 140 due to the electromagnetic interaction between the static magnetic field applied from a pair of permanent magnets 160 and the control current supplied to the driving coil 140. As a result, the movable part 120 on which the driving coil 140 is formed swings by the Lorentz force due to the electromagnetic interaction between the static magnetic field applied from a pair of permanent magnet 160 and the control current supplied to the driving coil 140. Namely, the movable part 120 swings to rotate around the rotational axis which is the X axis in FIG. 12.

As described above, according to the actuator 10 in the tenth example, the movable part 120 swings single-axially. Even the actuator 10 which swings the movable part 120 single-axially can enjoy various effects which the actuator 1 in the first example can enjoy, because the actuator 10 is provided with the plurality of pairs of torsion bars 230.

Incidentally, one portion of each composing element which is described in the first to tenth examples can be combined as occasion demands. Even in this case, an actuator which is obtained by combining each composing element which is described in the first to tenth examples can enjoy various effects described above.

In the present invention, various changes may be made, if desired, without departing from the essence or spirit of the invention which can be read from the claims and the entire specification. An actuator, which involves such changes, is also intended to be within the technical scope of the present invention.

DESCRIPTION OF REFERENCE CODES 110 outer support body
210 inner support body 120 movable part
130 torsion bar
230 torsion bar
231 hole
140 driving coil
150 wiring
160 permanent magnet

The invention claimed is:

1. An actuator comprising:
   a support part which supports a movable part; and
   a plurality of torsion bars each of which connects the movable part and the support part such that the movable part is capable of swinging around a rotational axis which is along a long direction, wherein,
   the plurality of torsion bars are arranged along a short direction of the torsion bars in a liner symmetric manner with respect to the rotational axis,
   the farther each torsion bar is from the rotational axis, the smaller a spring constant of each torsion bar is,
   at least one of the plurality of torsion bars includes a bending part and connecting parts,
   the bending part includes: a first part, a second part, and a third part, each of the first part and the second part extends along the short direction, the third part extends along the long direction and connects the first and second parts,
   one of the connecting parts connects the bending part and the movable part and the other one of the connecting parts connects the bending part and the support part, and
   each of the connecting parts extends in parallel with the rotational axis.

2. The actuator according to claim 1, wherein the farther each torsion bar is from the rotational axis, the smaller a width of each torsion bar is.

3. The actuator according to claim 1, wherein the farther each torsion bar is from the rotational axis, the smaller a density of each torsion bar is.

4. The actuator according to claim 3, wherein one or more hole is formed in at least one of the plurality of torsion bars.

5. The actuator according to claim 1, wherein the farther each torsion bar is from the rotational axis, the larger a length of each torsion bar is.

6. The actuator according to claim 5, wherein at least one of the plurality of torsion bars has such a turning shape that the at least one of the plurality of torsion bars turns around at least once or more toward a direction which is opposite to a direction along which at least one of the plurality of torsion bars extends from the support part to the movable part.

7. The actuator according to claim 6, wherein
   at least one of the other torsion bars other than one or two torsion bar which is located on the rotational axis or is closest to the rotational axis among the plurality of torsion bars has the turning shape, and
   one or two torsion bar which is closest to the rotational axis among the plurality of torsion bars does not have the turning shape.

8. The actuator according to claim 1, wherein,
   a central torsion bar that is one of the plurality of torsion bars and that is located on or that is closest to the rotational axis is disposed between a first torsion bar and a second torsion bar each of which is one of the plurality of torsion bars and that includes the bending part, and
   the central torsion bar does not include the bending part and linearly extends from the support part to the movable part.

9. The actuator according to claim 8, wherein each of the first and second torsion bars includes the bending part in which the third part bends to be away from the central torsion bar along the short direction.

10. The actuator according to claim 9, wherein,
    the plurality of torsion bars includes: a third torsion bar that is adjacent to the first torsion bar along the short direction and that is farther from the rotational axis along the short direction than the first torsion bar is; and a fourth torsion bar that is adjacent to the second torsion bar along the short direction and that is farther from the rotational axis along the short direction than the second torsion bar is,
    the third torsion bar includes the bending part in which the third part bends to be closer to the connecting part of the first torsion bar, and
    the fourth torsion bar includes the bending part in which the third part bends to be closer to the connecting part of the second torsion bar.

* * * * *